(12) United States Patent
Kondakov

(10) Patent No.: US 7,947,974 B2
(45) Date of Patent: May 24, 2011

(54) OLED DEVICE WITH HOLE-TRANSPORT AND ELECTRON-TRANSPORT MATERIALS

(75) Inventor: Denis Y. Kondakov, Kendall, NY (US)

(73) Assignee: Global OLED Technology LLC, Wilmington, DE (US)

( * ) Notice: Subject to any disclaimer, the term of this patent is extended or adjusted under 35 U.S.C. 154(b) by 510 days.

(21) Appl. No.: 12/054,750

(22) Filed: Mar. 25, 2008

(65) Prior Publication Data

US 2009/0242877 A1   Oct. 1, 2009

(51) Int. Cl.
*H01L 51/54* (2006.01)

(52) U.S. Cl. .................. 257/40; 313/504; 257/E51.026; 428/690

(58) Field of Classification Search .................... 257/40, 257/E51.001–E51.052; 438/82, 99; 313/504; 428/690, 917
See application file for complete search history.

(56) References Cited

U.S. PATENT DOCUMENTS

| | | |
|---|---|---|
| 3,172,862 A | 3/1965 | Gurnee et al. |
| 3,173,050 A | 3/1965 | Gurnee |
| 3,180,730 A | 4/1965 | Klupfel et al. |
| 3,567,450 A | 3/1971 | Brantly et al. |
| 3,658,520 A | 4/1972 | Brantly et al. |
| 3,710,167 A | 1/1973 | Dresner |
| 4,356,429 A | 10/1982 | Tang |
| 4,539,507 A | 9/1985 | Vanslyke et al. |
| 4,720,432 A | 1/1988 | Vanslyke et al. |
| 4,768,292 A | 9/1988 | Manzei |
| 4,769,292 A | 9/1988 | Tang et al. |
| 4,885,211 A | 12/1989 | Tang et al. |
| 4,885,221 A | 12/1989 | Tsuneeda et al. |
| 5,059,861 A | 10/1991 | Littman et al. |
| 5,059,862 A | 10/1991 | Vanslyke et al. |
| 5,061,569 A | 10/1991 | Vanslyke et al. |
| 5,121,029 A | 6/1992 | Hosokawa et al. |
| 5,141,671 A | 8/1992 | Bryan et al. |

(Continued)

FOREIGN PATENT DOCUMENTS

EP   0 732 868   9/1996

(Continued)

OTHER PUBLICATIONS

Tse, S.C., et al. "The Role of Charge-Transfer Integral in Determining and Engineering the Carrier Mobilities of 9,10-di(2-naphthyl)anthracene Compounds." Chem. Phys. Lett., vol. 422 (2006): pp. 354-357.*

(Continued)

*Primary Examiner* — Matthew W Such
(74) *Attorney, Agent, or Firm* — McKenna Long & Aldridge LLP

(57) ABSTRACT

An OLED device including an anode, a hole transporting layer (HTL), a light-emitting layer (LEL) comprising a host molecule and a light-emitting molecule, an electron transporting layer (ETL) and an cathode and wherein: (i) the HTL comprises a hole transporting material (HTM) having an oxidation potential that is at least 0.2 V less positive than the oxidation potential of the predominant material in the ETL and does not contain any bonds having an energy less than 105 kcal/mol; and (ii) the ETL comprises an electron transporting material (ETM) having a reduction potential ($RP_{etm}$) relative to the reduction potential of the predominant material in the HTL ($RP_{htm}$) that meets the requirement of $RP_{etm} > (RP_{htm} - 0.05)$. The OLED Device provides improvements in features including efficiency.

20 Claims, 2 Drawing Sheets

U.S. PATENT DOCUMENTS

| | | | |
|---|---|---|---|
| 5,150,006 | A | 9/1992 | Van Slyke et al. |
| 5,151,629 | A | 9/1992 | Van Slyke et al. |
| 5,247,190 | A | 9/1993 | Friend et al. |
| 5,276,380 | A | 1/1994 | Tang |
| 5,294,870 | A | 3/1994 | Tang et al. |
| 5,405,709 | A | 4/1995 | Littman et al. |
| 5,409,783 | A | 4/1995 | Tang et al. |
| 5,484,922 | A | 1/1996 | Moore et al. |
| 5,552,678 | A | 9/1996 | Tang et al. |
| 5,554,450 | A | 9/1996 | Shi et al. |
| 5,593,788 | A | 1/1997 | Shi et al. |
| 5,608,287 | A | 3/1997 | Hung et al. |
| 5,645,948 | A | 7/1997 | Shi et al. |
| 5,677,572 | A | 10/1997 | Hung et al. |
| 5,683,823 | A | 11/1997 | Shi et al. |
| 5,688,551 | A | 11/1997 | Littman et al. |
| 5,703,436 | A | 12/1997 | Forrest et al. |
| 5,714,838 | A | 2/1998 | Haight et al. |
| 5,739,545 | A | 4/1998 | Guha et al. |
| 5,755,999 | A | 5/1998 | Shi et al. |
| 5,766,779 | A | 6/1998 | Shi et al. |
| 5,776,622 | A | 7/1998 | Hung et al. |
| 5,776,623 | A | 7/1998 | Hung et al. |
| 5,837,391 | A | 11/1998 | Utsugi |
| 5,851,709 | A | 12/1998 | Grande et al. |
| 5,908,581 | A | 6/1999 | Chen et al. |
| 5,928,802 | A | 7/1999 | Shi et al. |
| 5,935,720 | A | 8/1999 | Chen et al. |
| 5,935,721 | A | 8/1999 | Shi et al. |
| 5,969,474 | A | 10/1999 | Arai |
| 5,981,306 | A | 11/1999 | Burrows et al. |
| 5,989,737 | A | 11/1999 | Xie et al. |
| 6,020,078 | A | 2/2000 | Chen et al. |
| 6,066,357 | A | 5/2000 | Tang et al. |
| 6,097,147 | A | 8/2000 | Baldo et al. |
| 6,137,223 | A | 10/2000 | Hung et al. |
| 6,140,763 | A | 10/2000 | Hung et al. |
| 6,172,459 | B1 | 1/2001 | Hung et al. |
| 6,208,075 | B1 | 3/2001 | Hung et al. |
| 6,208,077 | B1 | 3/2001 | Hung |
| 6,226,890 | B1 | 5/2001 | Boroson et al. |
| 6,237,529 | B1 | 5/2001 | Spahn et al. |
| 6,278,236 | B1 | 8/2001 | Madathil et al. |
| 6,284,393 | B1 | 9/2001 | Hosokawa et al. |
| 6,337,492 | B1 | 1/2002 | Jones et al. |
| 6,361,886 | B2 | 3/2002 | Shi et al. |
| 6,423,429 | B2 | 7/2002 | Kido et al. |
| 6,465,115 | B2 | 10/2002 | Shi et al. |
| 6,565,996 | B2 | 5/2003 | Hatwar et al. |
| 6,596,415 | B2 | 7/2003 | Shi et al. |
| 6,661,023 | B2 | 12/2003 | Hoag et al. |
| 6,689,493 | B2 | 2/2004 | Motomatsu et al. |
| 6,720,092 | B2 | 4/2004 | Hatwar |
| 6,720,573 | B2 | 4/2004 | Son et al. |
| 6,773,832 | B2 | 8/2004 | Sotoyama et al. |
| 6,824,895 | B1 | 11/2004 | Sowinski et al. |
| 6,936,961 | B2 | 8/2005 | Liao et al. |
| 7,165,340 | B2 | 1/2007 | Long |
| 7,232,588 | B2 | 6/2007 | Long |
| 7,238,389 | B2 | 7/2007 | Long |
| 7,288,285 | B2 | 10/2007 | Long |
| 7,288,286 | B2 | 10/2007 | Long |
| 7,625,601 | B2 | 12/2009 | Long |
| 2003/0068528 | A1 | 4/2003 | Thompson et al. |
| 2004/0018380 | A1* | 1/2004 | Aziz et al. ............. 428/690 |
| 2004/0113547 | A1 | 6/2004 | Son et al. |
| 2004/0255857 | A1 | 12/2004 | Chow et al. |
| 2005/0233165 | A1 | 10/2005 | Ido et al. |
| 2006/0134460 | A1 | 6/2006 | Kondakova et al. |
| 2006/0257684 | A1 | 11/2006 | Arakane et al. |
| 2007/0026257 | A1* | 2/2007 | Begley et al. ............. 428/690 |
| 2007/0046189 | A1* | 3/2007 | Hatwar et al. ............. 313/506 |
| 2007/0049778 | A1 | 3/2007 | Nomura et al. |

FOREIGN PATENT DOCUMENTS

| | | |
|---|---|---|
| EP | 0 891 121 | 1/1999 |
| EP | 1 009 041 | 6/2000 |
| EP | 1 029 909 | 8/2000 |
| EP | 1 076 368 | 2/2001 |
| JP | 09-13026 | 1/1997 |
| JP | 11-40356 | 2/1999 |
| JP | 11-228951 | 8/1999 |
| WO | WO 98/55561 | 12/1998 |
| WO | WO 00/18851 | 4/2000 |
| WO | WO 00/57676 | 9/2000 |
| WO | WO 00/70655 | 11/2000 |
| WO | WO 01/41512 | 6/2001 |
| WO | WO 01/93642 | 12/2001 |

OTHER PUBLICATIONS

Culligan, S.W., et al. "Effect of Hole Mobility Through Emissive Layer on Temporal Stability of Blue Organic Light-Emitting Diodes." Adv. Funct. Mater., vol. 16 (2006): pp. 1481-1487.*

Lever, A.B.P., et al. The Redox Chemistry of Metallophthalocyanines in Solution. Office of Naval Research. Contract N00014-91-J-1910, R&T Code 4131025, Technical Report #45, May 19, 1992.*

D'Andade, B.W., et al. "Relationship Between the Ionization and Oxidation Potentials of Molecular Organic Semiconductors." Org. Elect., vol. 6 (2005): pp. 11-20.*

U.S. Appl. No. 10/184,356, filed Jun. 27, 2002, Cosimbescu, Abandoned.

Kido et al., "Organic electroluminescent devices using lanthanide complexes", J. Alloys and Compounds 192, pp. 30-33, 1993.

Dresner, "Double Injection Electroluminescence in Anthracene", RCA Laboratories, Review, 30, 322, 1969.

Chen et al., "Recent Developments in Molecular Organic Electroluminescent Materials", Macromol. Symp. 125, pp. 1-48, 1997.

Hung et al., "Recent progress of molecular organic electroluminescent materials and devices", Materials Science and Engineering R39, pp. 143-222, 2002.

Kido et al. "Bright red-light-emitting organic electroluminescent devices having a europium complex as an emitter", Appl. Phys. Lett., 65, 2124 (1994).

Johnson et al., "Luminescent Iridium(I), Rhodium(I), and Platinum(II) Dithiolate Complexes", Journal of American Chemical Society, vol. 105, pp. 1795-1802, 1983.

Kido et al., "Electroluminescence in a Terbium Complex", Chem. Lett. pp. 657-660, 1990.

Kido et al, "White-light-Emitting Organic Electroliminescent Devices Using Lanthanide Complexes", Jpn. J. Apll. Phys., vol. 35, (1996) pp. L394-L-396.

D. Y. Kondakov, "Characterization of triplet-triplet annihiliation in organic light-emitting diodes based on anthracene derivatives", J. Appl. Phys., 102, 114504 (2007).

D. Y. Kondakov et al., "Operational degradation of organic light-emitting diodes: Mechanism and identification of Chemical products", J. Appl. Phys., 101, 024512 (2007).

Ma et al., "Electroluminescence from triplet metal-ligand charge-transfer excited state of transition metal complexes", Synthetic Metals 94, pp. 245-248, 1998.

Nonoyama "Benzo[$h$]quinolin-10-yl-$N$ Iridium (III) Complexes", (Bull. Chem. Soc. Jpn., 47, 767 (1974)).

C. Tang et al., J. Applied Physics, vol. 65, pp. 3610-3616, 1989.

Wrighton et al., The Nature of the Lowest Excited State in Tricarbonylchloro-1,10-phenanthrolinerhenium(I) and Related Complexes, Journal of the American Chemical Society, vol. 96, No. 4, pp. 998-1003, 1974.

Yam, "Luminescent carbon-rich rhenium(I) complexes", Chem. Commun. pp. 789-796, 2001.

W. R. Heineman and P. T. Kissinger, Laboratory Techniques in Electroanalytical Chemistry, Marcel Dekker, New York, 1996) pp. 51-76 (Book).

* cited by examiner

OLED DEVICE WITH HOLE-TRANSPORT AND ELECTRON-TRANSPORT MATERIALS

FIELD OF THE INVENTION

This invention relates to an organic light-emitting diode (OLED) electroluminescent (EL) device having a hole-transport layer and electron transport layer.

BACKGROUND OF THE INVENTION

While organic electroluminescent (EL) devices have been known for over two decades, their performance limitations have represented a barrier to many desirable applications. In simplest form, an organic EL device is comprised of an anode for hole injection, a cathode for electron injection, and an organic medium sandwiched between these electrodes to support charge recombination that yields emission of light. These devices are also commonly referred to as organic light-emitting diodes, or OLEDs. Representative of earlier organic EL devices are Gurnee et al. U.S. Pat. No. 3,172,862, issued Mar. 9, 1965; Gurnee U.S. Pat. No. 3,173,050, issued Mar. 9, 1965; Dresner, "Double Injection Electroluminescence in Anthracene", RCA Review, 30, 322, (1969); and Dresner U.S. Pat. No. 3,710,167, issued Jan. 9, 1973. The organic layers in these devices, usually composed of a polycyclic aromatic hydrocarbon, were very thick (much greater than 1 µm). Consequently, operating voltages were very high, often greater than 100V.

More recent organic EL devices include an organic EL element consisting of extremely thin layers (e.g. <1.0 µm) between the anode and the cathode. Herein, the term "organic EL element" encompasses the layers between the anode and cathode. Reducing the thickness lowered the resistance of the organic layers and has enabled devices that operate at much lower voltage. In a basic two-layer EL device structure, described first in U.S. Pat. No. 4,356,429, one organic layer of the EL element adjacent to the anode is specifically chosen to transport holes, and therefore is referred to as the hole-transporting layer, and the other organic layer is specifically chosen to transport electrons and is referred to as the electron-transporting layer. Recombination of the injected holes and electrons within the organic EL element results in efficient electroluminescence.

There have also been proposed three-layer organic EL devices that S contain an organic light-emitting layer (LEL) between the hole-transporting layer and electron-transporting layer, such as that disclosed by C. Tang et al. (*J. Applied Physics*, Vol. 65, 3610 (1989)). The light-emitting layer commonly consists of a host material doped with a guest material, otherwise known as a dopant. Still further, there has been proposed in U.S. Pat. No. 4,769,292 a four-layer EL element comprising a hole injecting layer (HIL), a hole-transporting layer (HTL), a light-emitting layer (LEL) and an electron-transporting/injecting layer (ETL). These structures have resulted in improved device efficiency.

EL devices in recent years have expanded to include not only single color emitting devices, such as red, green and blue, but also white-devices, devices that emit white light. Efficient white light producing OLED devices are highly desirable in the industry and are considered as a low cost alternative for several applications such as paper-thin light sources, backlights in LCD displays, automotive dome lights, and office lighting. White light producing OLED devices should be bright, efficient, and generally have Commission International d'Eclairage (CIE) chromaticity coordinates of about (0.33, 0.33). In any event, in accordance with this disclosure, white light is that light which is perceived by a user as having a white color.

Since the early inventions, further improvements in device materials have resulted in improved performance in attributes such as color, stability, luminance efficiency and manufacturability, e.g., as disclosed in U.S. Pat. Nos. 5,061,569, 5,409,783, 5,554,450, 5,593,788, 5,683,823, 5,908,581, 5,928,802, 6,020,078, and 6,208,077, amongst others.

Notwithstanding all of these developments, there are continuing needs for organic EL device components, such as hole transporting materials and/or electron transporting materials, that will provide even lower device drive voltages and hence lower power consumption, while maintaining high luminance efficiencies and long lifetimes combined with high color purity.

A useful class of electron-transporting materials is that derived from metal chelated oxinoid compounds including chelates of oxine itself, also commonly referred to as 8-quinolinol or 8-hydroxyquinoline. Tris(8-quinolinolato)aluminum (III), also known as ALQ or $ALQ_3$, and other metal and non-metal oxine chelates are well known in the art as electron-transporting materials. Baldo et al., in U.S. Pat. No. 6,097,147 and Hung et al., in U.S. Pat. No. 6,172,459 teach the use of an organic electron-transporting layer adjacent to the cathode so that when electrons are injected from the cathode into the electron-transporting layer, the electrons traverse both the electron-transporting layer and the light-emitting layer.

Diarylamine derivatives are the most common used materials for the hole transporting layer. However, the use of aromatic amines in close proximity to recombination zones where light is generated has certain disadvantages. Specifically, generation of amine radical-cations can cause quenching of excited states, thereby decreasing device efficiency. (see D. Y. Kondakov, J. Appl. Phys., 102, 114504 (2007)). Moreover, a C—N single bond is relatively weak (<105 kcal/mol) and can participate or initiate various OLED efficiency loss processes during operation. For a related example, see D. Y. Kondakov, W. C. Lenhart, and W. F. Nichols, J. Appl. Phys., 101, 024512 (2007).

Hydrocarbons such as anthracenes and other polycyclic aromatic hydrocarbons without amino substituents are also known as hole-transport materials. For example, the use of anthracenes as hole-transporting materials has been described in U.S. Pat. Nos. 6,465,115, 6,361,886, US2005/0233165, JP11-228951, U.S. Pat. No. 6,565,996 and US2007/0049778. Other types of non-amino substituted hydrocarbons suitable for hole transport layers have been disclosed in U.S. Pat. No. 6,596,415 and JP11-040356.

The use of non-amino substituted fluoranthenes in an electron-transporting layer has been described in US20060257684.

However, these devices do not have all desired EL characteristics in terms of high luminance and efficiency of the components in combination with low drive voltages.

Notwithstanding all these developments, there remains a need to improve efficiency while reducing or retaining drive voltages of OLED devices, as well as to provide embodiments with other improved features such as operational stability and color.

SUMMARY OF THE INVENTION

An OLED device comprising, in the following order, a anode, a hole transporting layer (HTL), a light-emitting layer (LEL) comprising a host molecule and a light-emitting molecule, an electron transporting layer (ETL) and an cathode and wherein:
  (i) the HTL comprises a hole transporting material (HTM) having an oxidation potential that is at least 0.2 V less positive than the oxidation potential of the predominant material in the ETL and does not contain any bonds having an energy less than 105 kcal/mol; and
  (ii) the ETL comprises an electron transporting material (ETM) having a reduction potential ($RP_{etm}$) relative to the reduction potential of the predominant material in the HTL ($RP_{htm}$) that meets the requirement of $RP > (RP_{htm} - 0.05)$.

Figure 2:
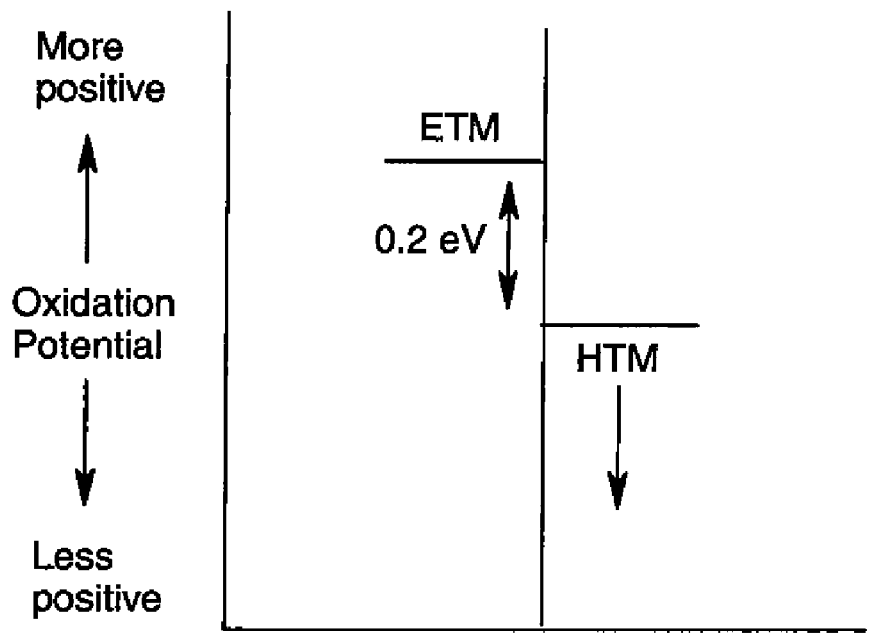
FIG. 2 shows an energy level diagram demonstrating the inventive relationship between the oxidation potential of a hole transporting material (HTM) in the HTL and the electron transporting material (ETM) in the ETL.
Figure 3:
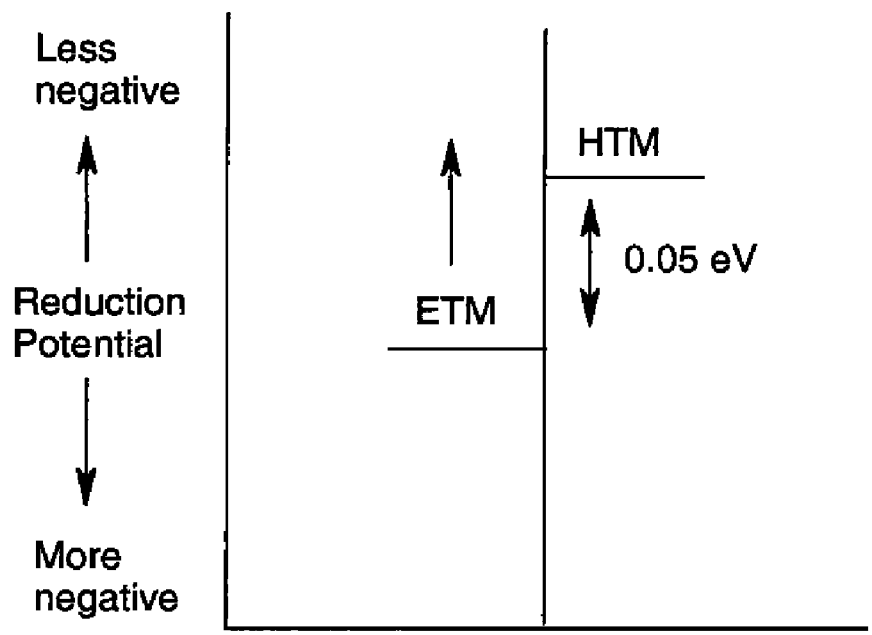
FIG. 3 shows an energy level diagram demonstrating the inventive relationship between the reduction potential of the predominant hole transporting material (HTM) in the HTL and the electron transporting material (ETM) in the ETL.

It will be noted in that FIGS. 2 and 3 are not to scale and only depict the relative energy levels between materials.

DETAILED DESCRIPTION OF THE INVENTION

The invention is generally as described above. An OLED device of the invention is a multilayer electroluminescent device comprising a cathode, an anode, light-emitting layer(s) (LEL), hole-transporting layer(s) (HTL), electron-transporting layer(s) (ETL) and optionally additional layers such as hole-injecting layer(s) (HIL), electron-injecting layer(s) (EIL), exciton-blocking layer(s) (XBL), spacer layer(s), connecting layer(s) and hole-blocking layer(s) (HBL).

The invention contains in the following order, a cathode, a hole transporting layer (HTL), a light-emitting layer (LEL) comprising a host molecule and a light-emitting molecule, an electron transporting layer (ETL) and an anode. Other layers may be present and may be located in between any of the above layers. It is preferred that the HTL be adjacent to the LEL on the cathode side and that the ETL be adjacent to the LEL on the anode side. As used herein, two layers are "adjacent" if one layer is juxtaposed with and shares a common boundary with the other layer.

The hole transport layer of the invention comprises at least one hole transport material (HTM) having an oxidation potential that is at least 0.2 V less positive than the oxidation potential of the predominant material in the ETL. As used herein, "predominant material" refers to the material that is present in the largest % by volume of all materials in that layer. If two or more materials are present at equal concentrations, then the value of the least positive oxidation potential should be used. The HTM cannot be any compound that contains bonds having an energy less than 105 kcal/mol nor should the hole transport layer cannot contain any other compounds that have bonds having an energy less than 105 kcal/mol.

As used herein, the 'energy' of a bond is defined as the standard bond dissociation energy, which is the enthalpy change for the process in which 1 mole of a specified bond is broken homolytically, with reactants and products in their standard states of a hypothetical gas at 1 atm and 25 deg C. All bond energies are expressed in kcal/mol. Molecular bonds having an energy less than 105 kcal/mol are relatively weak bonds. Whenever compounds with these kinds of bonds are present, it has been found that overall efficiency is low and oftentimes, stability of the device is decreased. The most comprehensive up-to-date listing of bond strengths may be found in "Handbook of Bond Dissociation Energies in Organic Compounds" by Y.-R. Luo, CRC Press, 2003. For reference, Table 1 lists selected examples of bond strengths of the kind commonly found in hole transport materials:

TABLE 1

Examples of Bond Strengths

| Bond | Energy (Kcal/mol) |
|---|---|
| $H—C_6H_5$ | 112 |
| $Br—C_6H_5$ | 83.5 |
| $C_6H_5—C_6H_5$ | 114 |
| $CH_3—C_6H_5$ | 102 |
| $H—CH_2C_6H_5$ | 89 |
| $CH_3CH_2—C_6H_5$ | 100 |
| $CH_3—CH_2C_6H_5$ | 76 |
| $CH_3O—C_6H_5$ | 99 |
| $CH_3—OC_6H_5$ | 64 |
| $H_2N—C_6H_5$ | 103 |
| $H—HNC_6H_5$ | 92 |
| $CH_3—N(CH_3)C_6H_5$ | 71 |
| $H_2C=CH_2$ | 174 |

From the data in Table 1, it is apparent that all molecules that include alkyl groups or heteroatoms such as N and O possess single bonds with bond dissociation energies substantially less than 105 Kcal/mol. Bonds with energies of 110 kcal/mol or greater are hydrogen-aryl, aryl-aryl or unsaturated bonds such as aromatic bonds. Thus, suitable HTMs or materials present in the HTL of the invention are aromatic compounds free from any substituents other than hydrogen or aryl groups. The most preferred HTMs are polycyclic aromatic hydrocarbons with only hydrogen or aryl substituents and are composed only of carbon and hydrogen with no heteroatoms present. It should be noted that aromatic compounds with diarylamino substituents cannot be the HTM of the invention nor can it be present in the HTL of the invention since they contains a C—N single bond with an energy of less than 105 kcal/mol.

A particularly suitable class of aromatic compounds free from any substituents, other than hydrogen or aryl groups, useful as a HTM material is an anthracene derivative according to formula (P):

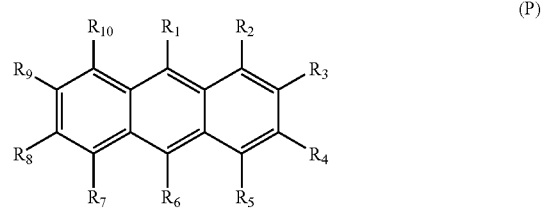

(P)

wherein:
  $R_1$-$R_{10}$ are independently chosen from hydrogen or aromatic groups from 1-24 carbon atoms. Particularly preferred are compounds where $R_1$ and $R_6$ are phenyl, biphenyl or naphthyl. Also preferred are anthracenes where $R_3$ is phenyl or naphthyl and $R_2$, $R_4$, $R_5$, $R_7$-$R_{10}$ are all hydrogen.

Anthracene compounds with substituents such as diarylamino or alkyl such as t-butyl are unsuitable as HTMs in this invention since they contain bonds with energies less than 105 Kcal/mol. A specific example of an unsuitable anthracene compound would be 2-t-butyl-9,10-di-(2-naphthyl)anthracene (TBADN) since the single bond between the anthracene and the t-butyl group has an energy of less than 105 Kcal/mol.

Particularly desirable are derivatives of 9,10-di-((1 or 2)-naphthyl)anthracenes. Illustrative examples includes 9,10-di-(2-naphthyl)anthracene (ADN) and 9-(1'-napthyl)-10-(2'-naphthyl)anthracene (P-4). Other examples of other suitable anthracenes are:

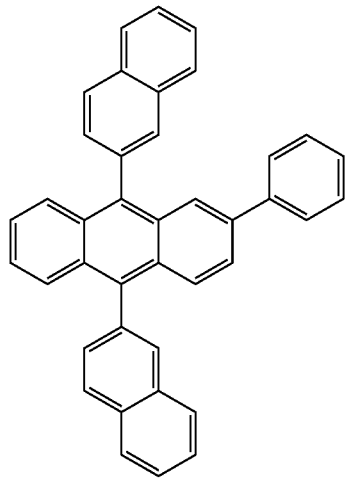

(P-1)

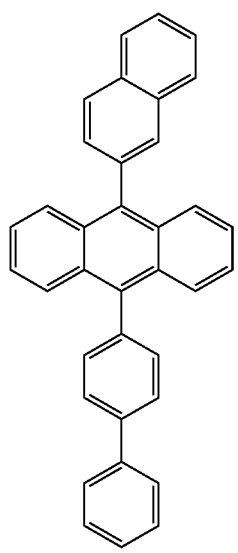

(P-2)

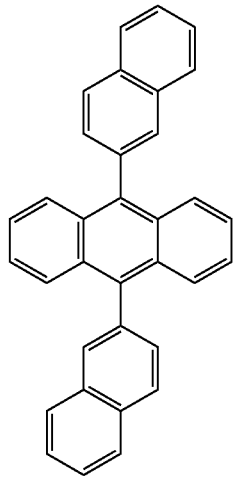

(P-3)

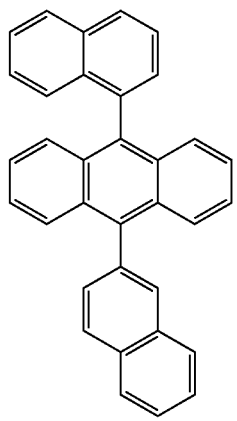

(P-4)

The HTL may be split into one or more sublayers so long as one of the sublayer; contains a HTM as defined and is free from compounds that have bonds having an energy less than 105 kcal/mol. The hole transporting layer is a non-luminescent layer; that is, it should provide less than 10% of the total device emission. Ideally, it should have substantially no light emission.

The thickness of the HTL is in the range of from 5 nm to 200 nm, preferably, in the range of from 10 nm to 150 nm, or most preferably from 50 to 100 nm.

The ETL of the invention contains an electron transporting material (ETM) having a reduction potential more positive than 0.05 V more negative than the reduction potential of the predominant material in the HTL Preferably, the electron-transporting layer (ETL) of the invention is located between the cathode and a light emitting layer (LEL).

The ETM can be any known electron transporting material so long as it has the appropriate oxidation and reduction potentials relative to the HTM. When more than one ETM is present, the reduction potential of the predominant ETM should be used. If two or more materials are present at equal concentrations, then the value of the least negative reduction potential should be used.

One class of preferred ETMs are fluoranthenes according to formula (II):

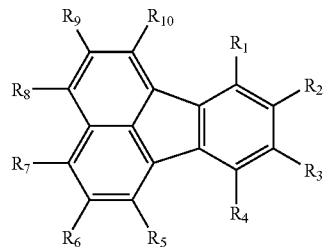

(I)

wherein:

R$_1$-R$_{10}$ are hydrogen or substituents, which the proviso that any two adjacent substituents can be joined together to form an addition ring system. Preferred substituents, when present, are aromatic groups including heteroaromatic groups. Examples of specific preferred substituents are phenyl, biphenyl and naphthyl. The most preferred substituents are where R$_1$ and R$_4$ are both phenyl or naphthyl groups.

Specific examples of fluoranthene compounds suitable for use in the ETL are as follows:

ETM1

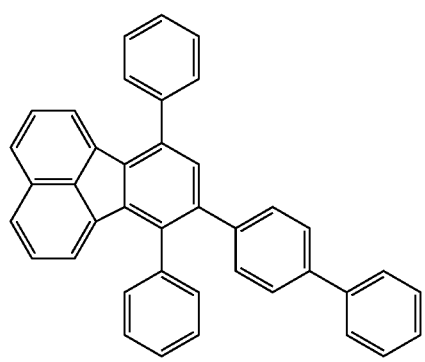

ETM2

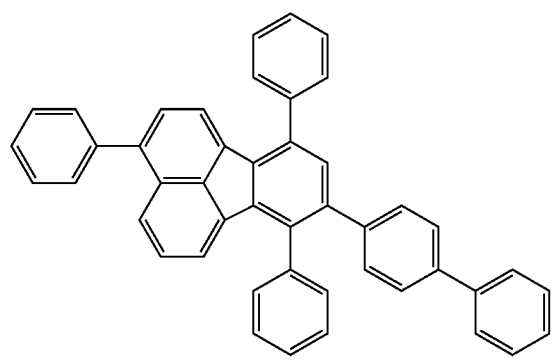

ETM3

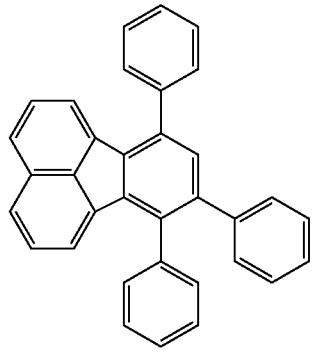

ETM4

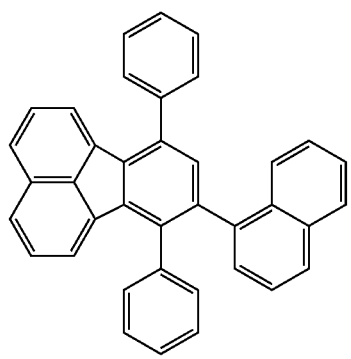

ETM5

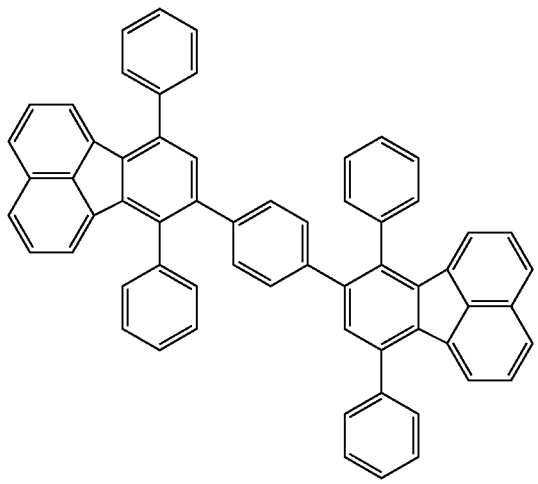

ETM6

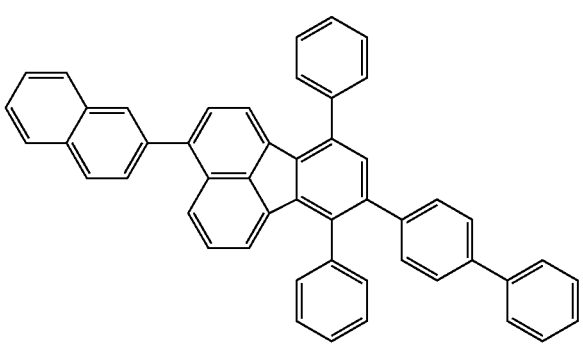

ETM7
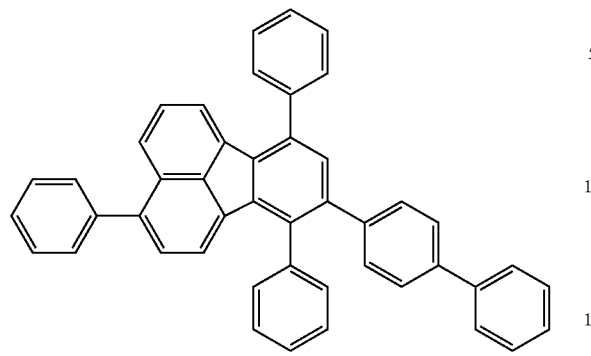
ETM11
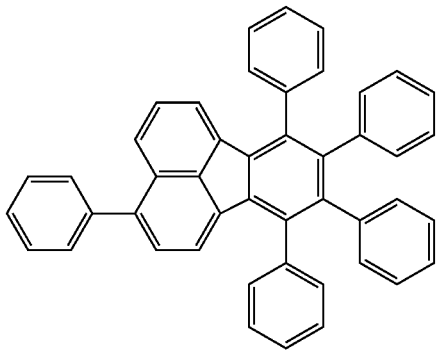
ETM8
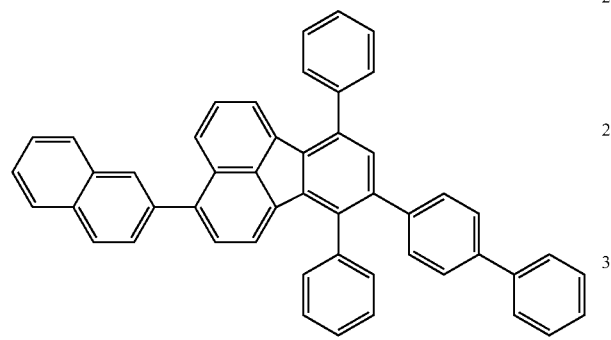
ETM12
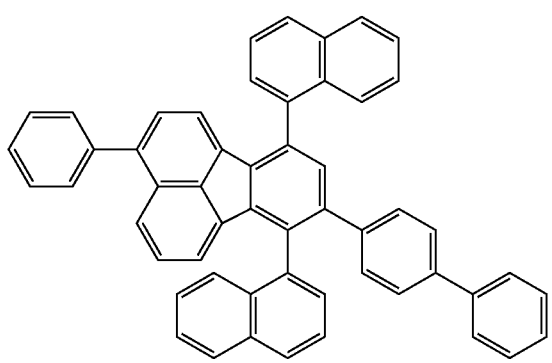
ETM9
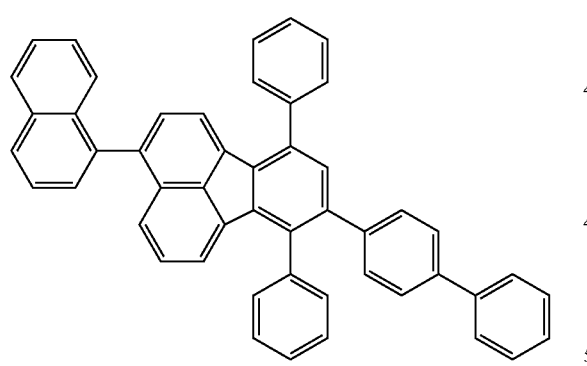
ETM13
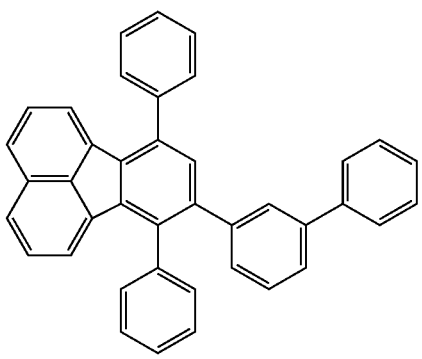
ETM10
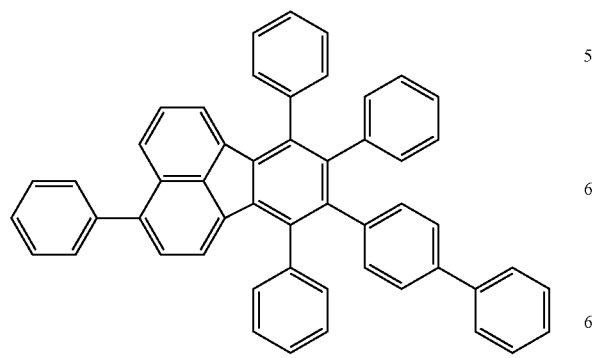
ETM14
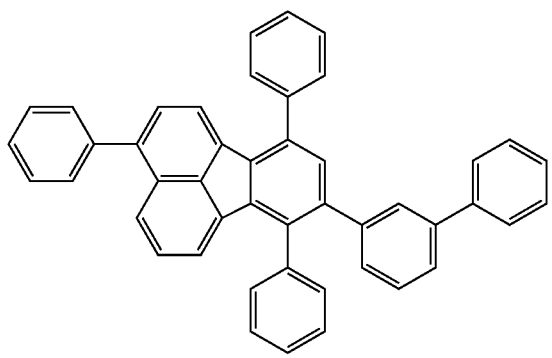

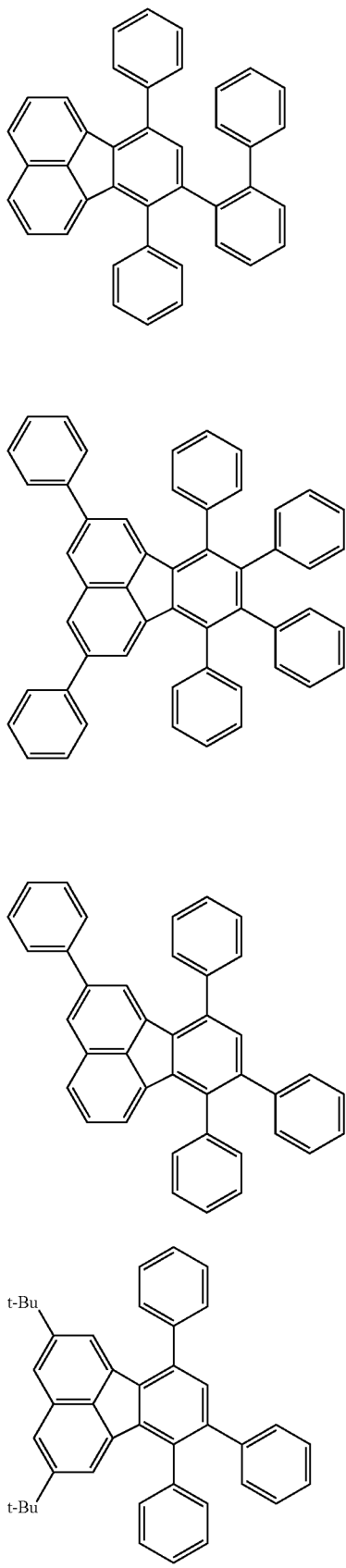
ETM15
ETM16
ETM17
ETM18
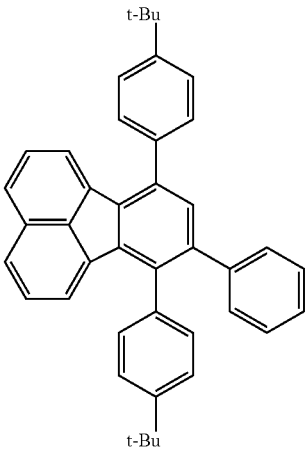
ETM19
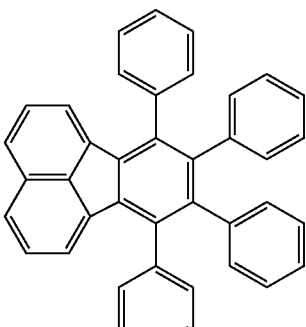
ETM20
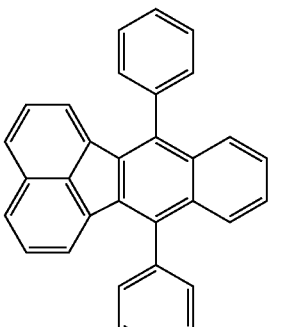
ETM21
ETM22
One class of preferred ETMs are phenanthrolines. Suitable substituted phenanthrolines for this application are according to formula (R):

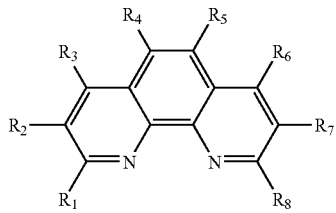
(R)

In formula (R), $R_1$-$R_8$ are independently hydrogen, alkyl group, aryl or substituted aryl group, and at least one of $R_1$-$R_8$ is aryl group or substituted aryl group.

Specific examples of the phenanthrolines useful in the ETL are 2,9-dimethyl-4,7-diphenyl-phenanthroline (BCP) (see formula R-1) and 4,7-diphenyl-1,10-phenanthroline (Bphen) (see formula R-2).

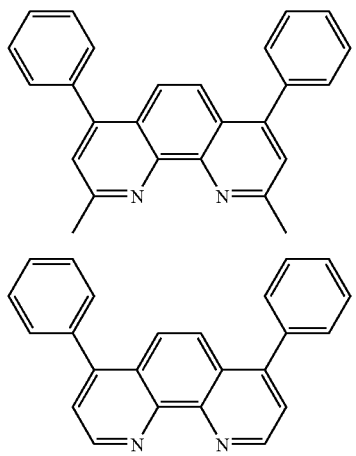

R-1

R-2

One class of suitable ETMs are organic gallium complexes according to Formula ($G_a$):

GaL$_3$ where the gallium is in a +3 valence state and L represent a monoionic ligand such that the complex has an overall neutral charge. The L groups can be the same or different but at least one must be organic. Desirably, at least two of the L groups are bidentate and contain at least one nitrogen that can form a dative or coordinative bond to the gallium. More preferably, all three ligands are bidentate and contain at least one nitrogen that can form a dative or coordinative bond to the gallium.

The most preferred organic gallium complexes are according to Formula ($G_a$-1):

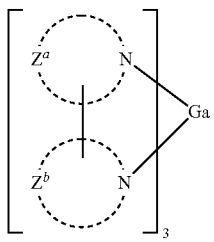

($G_a$-1)

In Formula ($G_a$-1), the ligands in the metal complex can each be the same or different from one another. In one embodiment, the ligands are the same.

Each $Z^a$ and $Z^b$ is independently selected and represents the atoms necessary to complete an unsaturated heterocyclic ring. For example, $Z^a$ and $Z^b$ may represent the atoms necessary to complete an unsaturated five- or six-membered heterocyclic ring. In one embodiment, the ring is an aromatic ring. Examples of suitable aromatic rings are a pyridine ring group and an imidazole ring group.

$Z^a$ and $Z^b$ are directly bonded to one another. In addition to being directly bonded, $Z^a$ and $Z^b$ may be further linked together to form a fused ring system. However, in one embodiment, $Z^a$ and $Z^b$ are not further linked together.

Illustrative examples of $Z^a$ and $Z^b$ are shown below.

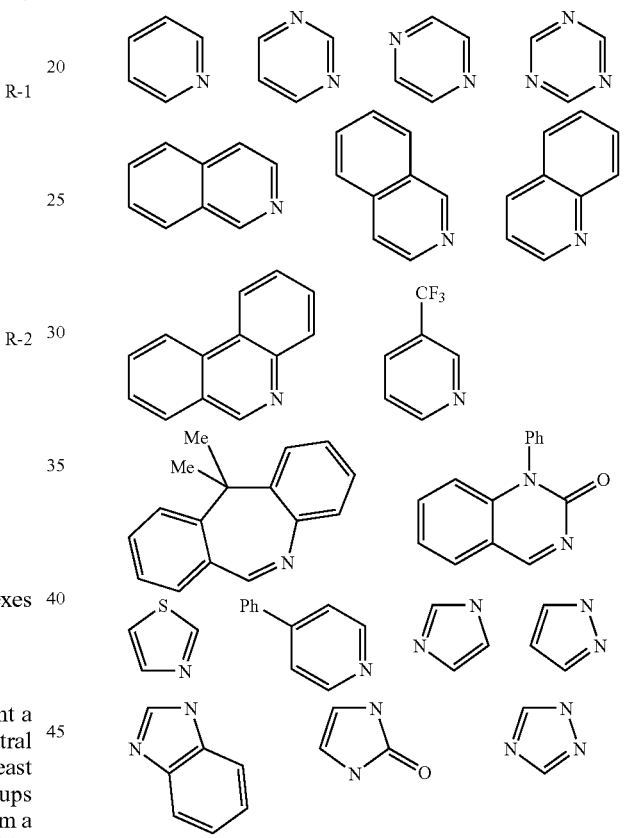

In Formula ($G_a$-1), the gallium bond to the nitrogen of one heterocycle is an ionic bond. An ionic bond is an electrical attraction between two oppositely charged atoms or groups of atoms. In this case, the metal is positively charged and one nitrogen of one heterocycle is negatively charged and the gallium and this nitrogen are bonded together. However, it should be understood that this bond could have some covalent character, depending on the particular metal and heterocycle. By way of example, a deprotonated imidazole would be capable of forming an ionic bond of this type with the metal.

In Formula ($G_a$-1), the gallium bond to the nitrogen of the other heterocycle is dative. A dative bond (also called a donor/acceptor bond) is a bond involving a shared pair of electrons in which both electrons come from the same atom, in this case, the nitrogen of the heterocycle. For example, a pyridine has a nitrogen with two unshared electrons that can be donated to the metal to form a dative bond.

In one aspect of the invention, the metal complex is represented by Formula (G$_a$-2).

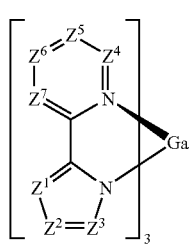

Formula (G$_a$-2)

Each $Z^1$ through $Z^7$ represents N or C—Y. In one embodiment, no more than two, and desirably no more than one of $Z^1$ to $Z^3$ represent N. In another embodiment, no more than one of $Z^4$ to $Z^7$ represents N. Each Y represents hydrogen or an independently selected substituent. Examples of substituents include an alkyl group such as methyl group, an aromatic group such as a phenyl group, a cyano substituent, and a trifluoromethyl group. Two Y substituents may join to form a ring group, for example a fused benzene ring group. In one aspect of the invention, $Z^4$ through $Z^7$ represent C—Y.

Illustrative examples of organic gallium complexes of Formula (G$_a$) are given below.

GaC-1

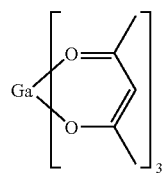

GaC-2

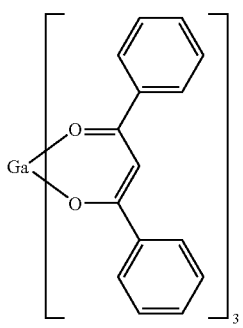

GaC-3     Ga(O$_2$CC$_6$H$_5$)$_3$

GaC-4

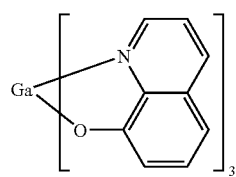

GaC-5

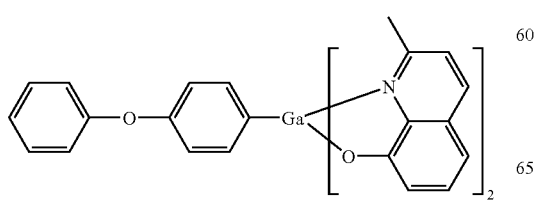

GaC-6

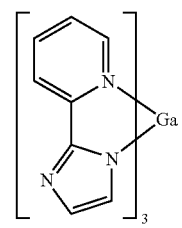

GaC-7

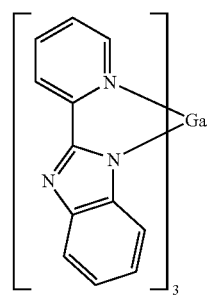

GaC-8

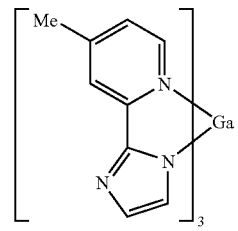

GaC-9

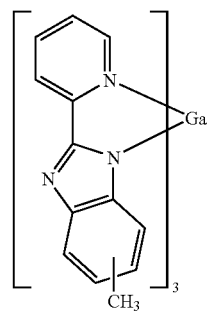

GaC-10

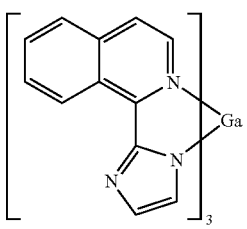

-continued

GaC-11 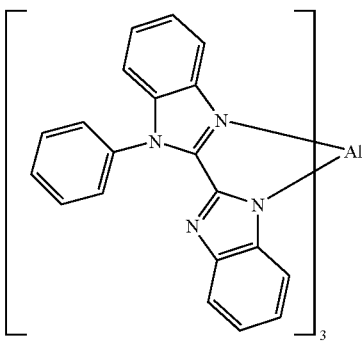

GaC-12 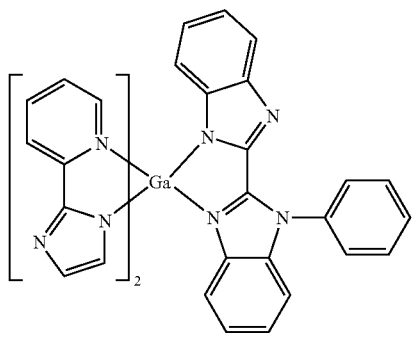

GaC-13 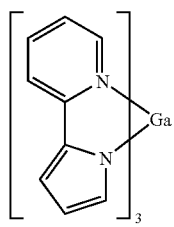

GaC-14 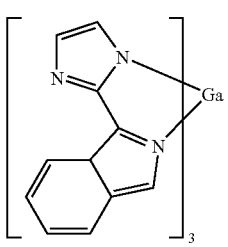

GaC-15 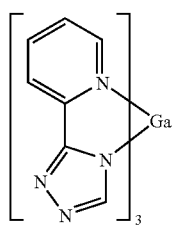

GaC-16 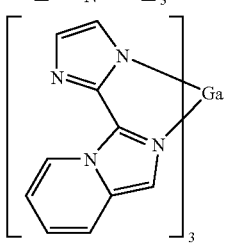

The ETL may be split into one or more sublayers so long as one of the sublayers contains an ETM as defined. The electron transporting layer is a non-luminescent layer; that is, it should provide less than 10% of the total device emission. Ideally, it should have substantially no light emission.

The thickness of the ETL is in the range of from 5 nm to 200 nm, preferably, in the range of from 10 nm to 150 nm, or most preferably, in the range of 25-75 nm.

A listing of representative oxidation and reduction potentials for common materials is shown in Table 2. The definitions of oxidation (Eox) and reduction (Ered) potentials are well known, as are the appropriate measurement techniques. (W. R. Heineman and P. T. Kissinger, Laboratory Techniques in Electroanalytical Chemistry, Marcel Dekker, New York, 1996). For this invention, oxidation and reduction potentials of materials are determined experimentally by electrochemical measurement. All oxidation and reduction potentials reported in Volts and were measured in a 1:1 mixture of acetonitrile and toluene relative to a SCE unless noted. For materials not soluble under these conditions, direct comparisons in any suitable solvent system can be made.

TABLE 2

Oxidation and Reduction Potentials

| Material | Oxidation Potential | Reduction Potential |
|---|---|---|
| ALQ | 1.20 | −2.00 |
| Bphen | 1.80 | −1.90 |
| ETM21 | 1.60 | −1.73 |
| GaC-7 | 1.60 | −1.63 |
| P-2 | 1.31 | −1.86 |
| NPB | 0.86 | −2.60 |
| P-1 | 1.31 | −1.85 |
| TBADN | 1.25 | −1.90 |
| P-4 | 1.34 | −1.85 |
| P-3 | 1.29 | −1.80 |
| Balq | 1.40 | −1.80 |
| BCP | 1.75 | −2.00 |
| ALMQ | 1.15 | −1.88 |
| ETM1 | 1.65 | −1.69 |
| ETM22 | 1.49 | −1.80 |
| CuPc* | ~1.0 | ~0.85 |

*Copper Phthalocyanine: estimated from THF due to poor solubility

The predominant HTM in the HTL must be chosen such that it has an oxidation potential ($OP_{htm}$) that is at least 0.2 V less positive than the oxidation potential of the predominant ETM in the ETL ($OP_{etm}$). This relationship is schematically shown in FIG. 2. Oxidation potentials (in V) are generally positive values. Inventive materials fit the relationship: $OP_{htm} < (OP_{etm} - 0.2 \text{ V})$.

Desirably, the HTM has an oxidation potential of 1.50 V or less and a reduction potential of −1.70 V or more negative. Even more preferably, the HTM has an oxidation potential of less than 1.35 V and a reduction potential more negative than −1.80 V.

The predominant ETM in the ETL must be chosen such that it has a reduction potential ($RP_{etm}$) relative to the reduction potential of the predominant material in the HTL ($RP_{htm}$) that meets the requirement of $RP_{etm} > (RP_{htm} - 0.05)$. This relationship is schematically shown in FIG. 3. Reduction potentials are generally negative values. For inventive combinations, $RP_{etm}$ must be more positive (less negative) than 0.05 V less than $RP_{htm}$. Thus, $RP_{etm}$ can never be more negative than 0.05 V less than $RP_{htm}$.

Desirably, the ETM has an oxidation potential of 1.50 V or greater and a reduction potential of −1.95 V or less negative. Even more preferably, the ETM will have an oxidation potential of at least 1.60 or even 1.70 V with a reduction potential not more negative than −1.85 or even −1.75 V.

Examples of preferred combinations of the invention are those wherein the HTM compound is selected from P-1 or P-2 and the ETM is selected from ETM21 or GaC-7.

Figure 1:
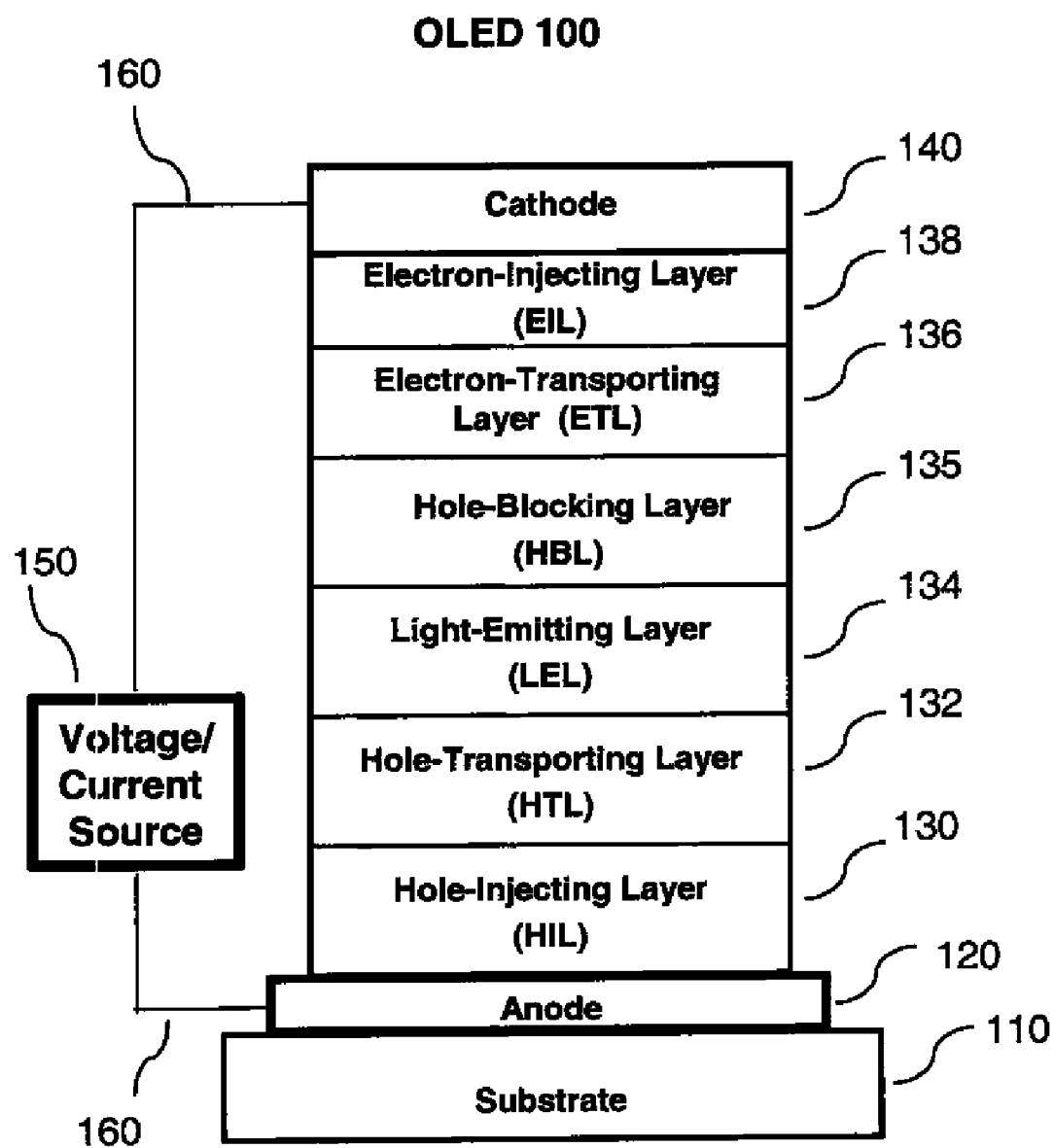
FIG. 1 shows a schematic cross-sectional view of one embodiment of the OLED device of the present invention. It will be understood that FIG. 1 is not to scale since the individual layers are too thin and the thickness differences of various layers are too great to permit depiction to scale.

FIG. 1 shows one embodiment of the invention in which hole-transporting and electron-transporting layers are present. The HTMs of the inventions are located in the hole-transporting layer (HTL, 132). The ETMs of the invention are located in the electron-transporting layer (ETL, 136). An optional hole-blocking layer (HBL, 135) is shown between the light-emitting layer and the electron-transporting layer. In another embodiment, there is no hole-blocking layer (HBL, 135) Located between the ETL and the LEL. The figure also shows an optional hole-injecting layer (HIL, 130). In yet other embodiments, there may be more than one hole-injecting, electron-injecting and electron-transporting layers.

In one suitable embodiment the EL device includes a means for emitting white light, which may include complimentary emitters, a white emitter, or a filtering means. The device may also include combinations of fluorescent emitting materials and phosphorescent emitting materials (sometimes referred to as hybrid OLED devices). To produce a white emitting device, ideally the hybrid fluorescent/phosphorescent device would comprise a blue fluorescent emitter and proper proportions of a green and red phosphorescent emitter, or other color combinations suitable to make white emission. However, hybrid devices having non-white emission may also be useful by themselves. Hybrid fluorescent/phosphorescent elements having non-white emission may also be combined with additional phosphorescent elements in series in a stacked OLED. For example, white emission may be produced by one or more hybrid blue fluorescent/red phosphorescent elements stacked in series with a green phosphorescent element using p/n junction connectors as disclosed in Tang et al U.S. Pat. No. 6,936,961B2. This invention may be used in so-called stacked device architecture, for example, as taught in U.S. Pat. No. 5,703,436 and U.S. Pat. No. 6,337,492.

In one desirable embodiment the EL device is part of a display device. In another suitable embodiment the EL device is part of an area lighting device.

The EL device of the invention is useful in any device where stable light emission is desired such as a lamp or a component in a static or motion imaging device, such as a television, cell phone, DVD player, or computer monitor.

As used herein and throughout this application, the term carbocyclic and heterocyclic rings or groups are generally as defined by the *Grant & Hackh's Chemical Dictionary*, Fifth Edition, McGraw-Hill Book Company. A carbocyclic ring is any aromatic or non-aromatic ring system containing only carbon atoms and a heterocyclic ring is any aromatic or non-aromatic ring system containing both carbon and non-carbon atoms such as nitrogen (N), oxygen (O), sulfur (S), phosphorous (P), silicon (Si), gallium (Ga), boron (B), beryllium (Be), indium (In), aluminum (Al), and other elements found in the periodic table useful in forming ring systems. For the purpose of this invention, also included in the definition of a heterocyclic ring are those rings that include coordinate bonds. The definition of a coordinate or dative bond can be found in *Grant & Hackh's Chemical Dictionary*, pages 91 and 153. In essence, a coordinate bond is formed when electron rich atoms such as O or N, donate a pair of electrons to electron deficient atoms or ions such as aluminum, boron or alkali metal ions such $Li^+$, $Na^+$, $K^+$ and $Cs^+$. One such example is found in tris(8-quinolinolato)aluminum(III), also referred to as Alq, wherein the nitrogen on the quinoline moiety donates its lone pair of electrons to the aluminum atom thus forming the heterocycle and hence providing Alq with a total of 3 fused rings. The definition of a ligand, including a multidentate ligand, can be found in *Grant & Hackh's Chemical Dictionary*, pages 337 and 176, respectively.

Unless otherwise specifically stated, use of the term "substituted" or "substituent" means any group or atom other than hydrogen. Additionally, when the term "group" is used, it means that when a substituent group contains a substitutable hydrogen, it is also intended to encompass not only the substituent's unsubstituted form, but also its form further substituted with any substituent group or groups as herein mentioned, so long as the substituent does not destroy properties necessary for device utility. Suitably, a substituent group may be halogen or may be bonded to the remainder of the molecule by an atom of carbon, silicon, oxygen, nitrogen, phosphorous, sulfur, selenium, or boron. The substituent may be, for example, halogen, such as chloro, bromo or fluoro; nitro; hydroxyl; cyano; carboxyl; or groups which may be further substituted, such as alkyl, including straight or branched chain or cyclic alkyl, such as methyl, trifluoromethyl, ethyl, t-butyl, 3-(2,4-di-t-pentylphenoxy)propyl, and tetradecyl; alkenyl, such as ethylene, 2-butene; alkoxy, such as methoxy, ethoxy, propoxy, butoxy, 2-methoxyethoxy, sec-butoxy, hexyloxy, 2-ethylhexyloxy, tetradecyloxy, 2-(2,4-di-t-pentylphenoxy)ethoxy, and 2-dodecyloxyethoxy; aryl such as phenyl, 4-t-butylphenyl, 2,4,6-trimethylphenyl, naphthyl; aryloxy, such as phenoxy, 2-methylphenoxy, alpha- or beta-naphthyloxy, and 4-tolyloxy; carbonamido, such as acetamido, benzamido, butyramido, tetradecanamido, alpha-(2,4-di-t-pentylphenoxy)acetamido, alpha-(2,4-di-t-pentylphenoxy)butyramido, alpha-(3-pentadecylphenoxy)-hexanamido, alpha-(4-hydroxy-3-t-butylphenoxy)-tetradecanamido, 2-oxo-pyrrolidin-1-yl, 2-oxo-5-tetradecylpyrrolin-1-yl, N-methyltetradecanamido, N-succinimido, N-phthalimido, 2,5-dioxo-1-oxazolidinyl, 3-dodecyl-2,5-dioxo-1-imidazolyl, and N-acetyl-N-dodecylamino, ethoxycarbonylamino, phenoxycarbonylamino, benzyloxycarbonylamino, hexadecyloxycarbonylamino, 2,4-di-t-butylphenoxycarbonylamino, phenylcarbonylamino, 2,5-(di-t-pentylphenyl)carbonylamino, p-dodecyl-phenylcarbonylamino, p-tolylcarbonylamino, N-methylureido, N,N-dimethylureido, N-methyl-N-dodecylureido, N-hexadecylureido, N,N-dioctadecylureido, N,N-dioctyl-N'-ethylureido, N-phenylureido, N,N-diphenylureido, N-phenyl-N-p-tolylureido, N-(m-hexadecylphenyl)ureido, N,N-(2,5-di-t-pentylphenyl)-N'-ethylureido, and t-butylcarbonamido; sulfonamido, such as methylsulfonamido, benzenesulfonamido, p-tolylsulfonamido, p-dodecyl-benzenesulfonamido, N-methyltetradecylsulfonamido, N,N-dipropylsulfamoylamino, and hexadecylsulfonamido; sulfamoyl, such as N-methylsulfamoyl, N-ethylsulfamoyl, N,N-dipropylsulfamoyl, N-hexadecylsulfamoyl, N,N-dimethylsulfamoyl, N-[3-(dodecyloxy)propyl]sulfamoyl, N-[4-(2,4-di-r-pentylphenoxy)butyl]sulfamoyl, N-methyl-N-tetradecylsulfamoyl, and N-dodecylsulfamoyl; carbamoyl, such as N-methylcarbamoyl, N,N-dibutylcarbamoyl, N-octadecylcarbamoyl, N-[4-(2,4-di-t-pentylphenoxy)butyl]carbamoyl, N-methyl-N-tetradecylcarbamoyl, and N,N-dioctylcarbamoyl; acyl, such as acetyl, (2,4-di-t-amylphenoxy)acetyl, phenoxycarbonyl, p-dodecyloxyphenoxycarbonyl methoxycarbonyl, butoxycarbonyl, tetradecyloxycarbonyl, ethoxycarbonyl, benzyloxycarbonyl, 3-pentadecyloxycarbonyl, and dodecyloxycarbonyl; sulfonyl, such as methoxysulfonyl, octyloxysulfonyl, tetradecyloxysulfonyl, 2-ethylhexyloxysulfonyl, phenoxysulfonyl, 2,4-di-t-pentylphenoxysulfonyl, methylsulfonyl, octylsulfonyl, 2-ethylhexylsulfonyl, dodecylsulfonyl, hexadecylsulfonyl, phenylsulfonyl, 4-nonylphenylsulfonyl, and p-tolylsulfonyl; sulfonyloxy, such as dodecylsulfonyloxy, and hexadecylsulfonyloxy, sulfinyl, such as methylsulfinyl, octylsulfinyl, 2-ethylhexylsulfinyl, dodecylsulfinyl, hexadecylsulfinyl, phenylsulfinyl, 4-nonylphenylsulfinyl, and p-tolylsulfinyl; thio, such as ethylthio, octylthio, benzylthio, tetradecylthio, 2-(2,4-di-t-pentylphenoxy)ethylthio, phenylthio, 2-butoxy-5-t-octylphenylthio, and p-tolylthio; acyloxy, such as acetyloxy, benzoyloxy, octadecanoyloxy, p-dodecylamidobenzoyloxy, N-phenylcarbamoyloxy, N-ethylcarbamoyloxy, and cyclohexylcarbonyloxy; amine, such as phenylanilino, 2-chloroanilino, diethylamine, dodecylamine; imino, such as 1(N-phenylimido)ethyl, N-succinimido or 3-benzylhydantoinyl; phosphate, such as dimethylphosphate and ethylbutylphosphate; phosphite, such as diethyl and dihexylphosphite; a heterocyclic group, a heterocyclic oxy group or a heterocyclic thio group, each of which may be substituted and which contain a 3 to 7 membered heterocyclic ring composed of carbon atoms and at least one hetero atom selected from the group consisting of oxygen, nitrogen, sulfur, phosphorous, or boron. Such as 2-furyl, 2-thienyl, 2-benzimidazolyloxy or 2-benzothiazolyl; quaternary ammonium, such as triethylammonium; quaternary phosphonium, such as triphenylphosphonium; and silyloxy, such as trimethylsilyloxy.

If desired, the substituents may themselves be further substituted one or more times with the described substituent groups. The particular substituents used may be selected by those skilled in the art to attain desirable properties for a specific application and can include, for example, electron-withdrawing groups, electron-donating groups, and steric groups. When a molecule may have two or more substituents, the substituents may be joined together to form a ring such as a fused ring unless otherwise provided. Generally, the above groups and substituents thereof may include those having up to 48 carbon atoms, typically 1 to 36 carbon atoms and usually less than 24 carbon atoms, but greater numbers are possible depending on the particular substituents selected.

The following is the description of the layer structure, material selection, and fabrication process for OLED devices.

General OLED Device Architecture

The present invention can be employed in many OLED configurations using small molecule materials, oligomeric materials, polymeric materials, or combinations thereof. These include from very simple structures having a single anode and cathode to more complex devices, such as passive matrix displays having orthogonal arrays of anodes and cathodes to form pixels, and active-matrix displays where each pixel is controlled independently, for example, with thin film transistors (TFTs). There are numerous configurations of the organic layers wherein the present invention is successfully practiced. For this invention, essential requirements are a cathode, an anode, a LEL, an ETL and a HIL.

One embodiment according to the present invention and especially useful for a small molecule device is shown in FIG. 1. OLED 100 contains a substrate 110, an anode 120, a hole-injecting layer 130, a hole-transporting layer 132, a light-emitting layer 134, a hole-blocking layer 135, an electron-transporting layer 136, an electron-injecting layer 138 and a cathode 140. In some other embodiments, there are optional spacer layers on either side of the LEL. These spacer layers do not typically contain light emissive materials. All of these layer types will be described in detail below. Note that the substrate may alternatively be located adjacent to the cathode, or the substrate may actually constitute the anode or cathode. Also, the total combined thickness of the organic layers is preferably less than 500 nm.

The anode and cathode of the OLED are connected to a voltage/current source 150, through electrical conductors 160. Applying a potential between the anode and cathode such that the anode is at a more positive potential than the cathode operates the OLED. Holes are injected into the organic EL element from the anode. Enhanced device stability can sometimes be achieved when the OLED is operated in an AC mode where, for some time period in cycle, the potential bias is reversed and no current flows. An example of an AC driven OLED is described in U.S. Pat. No. 5,552,678.

Anode

When the desired EL emission is viewed through the anode, anode 120 should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfide, such as zinc sulfide, can be used as the anode 120. For applications where EL emission is viewed only through the cathode 140, the transmissive characteristics of the anode 120 are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes. Optionally, anodes may be polished prior to application of other layers to reduce surface roughness so as to minimize short circuits or enhance reflectivity.

Hole Injection Layer

Although it is not always necessary, it is often useful to provide an HIL in the OLEDs. HIL 130 in the OLEDs can serve to facilitate hole injection from the anode into the HTL, thereby reducing the drive voltage of the OLEDs. Suitable materials for use in HIL 130 include, but are not limited to, porphyrinic compounds as described in U.S. Pat. No. 4,720,432 and some aromatic amines, for example, 4,4',4"-tris[(3-ethylphenyl)phenylamino]triphenylamine (m-TDATA). Alternative hole-injecting materials reportedly useful in OLEDs are described in EP 0 891 121 A1 and EP 1 029 909 A1. Aromatic tertiary amines discussed below can also be useful as hole-injecting materials. Other useful hole-injecting materials such as dipyrazino[2,3-f:2',3'-h]quinoxalinehexacarbonitrile are described in U.S. Patent Application Publication 2004/0113547 A1 and U.S. Pat. No. 6,720,573. In addition, a p-type doped organic layer is also useful for the HIL as described in U.S. Pat. No. 6,423,429. The term "p-type doped organic layer" means that this layer has semiconducting properties after doping, and the electrical current through this layer is substantially carried by the holes. The conductivity is provided by the formation of a charge-transfer complex as a result of hole transfer from the dopant to the host material.

The thickness of the HIL 130 is in the range of from 0.1 nm to 200 nm, preferably, in the range of from 0.5 nm to 150 nm.

Hole Transport Layer

The invention contains a HTL as generally described above. However, there may be more than one HTL and the following describes suitable materials and designs for any additional HTL. The HTL contains at least one hole-transporting material such as an aromatic tertiary amine, where the latter is understood to be a compound containing at least one trivalent nitrogen atom that is bonded only to carbon atoms, at least one of which is a member of an aromatic ring. In one form the aromatic tertiary amine is an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals or at least one active hydrogen-containing group are disclosed by Brantley, et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural Formula (A)

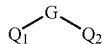

(A)

wherein:
Q$_1$ and Q$_2$ are independently selected aromatic tertiary amine moieties; and
G is a linking group such as an arylene, cycloalkylene, or alkylene group of a carbon to carbon bond.

In one embodiment, at least one of Q$_1$ or Q$_2$ contains a polycyclic fused ring structure, e.g., a naphthalene. When G is an aryl group, it is conveniently a phenylene, biphenylene, or naphthalene moiety.

A useful class of triarylamines satisfying structural Formula A and containing two triarylamine moieties is represented by structural Formula (B)

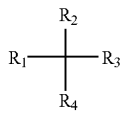

(B)

wherein:
R$_1$ and R$_2$ each independently represents a hydrogen atom, an aryl group, or an alkyl group or R$_1$ and R$_2$ together represent the atoms completing a cycloalkyl group; and
R$_3$ and R$_4$ each independently represents an aryl group, which is in turn substituted with a diaryl substituted amino group, as indicated by structural Formula (C)

(C)

wherein:
R$_5$ and R$_6$ are independently selected aryl groups. In one embodiment, at least one of R$_5$ or R$_6$ contains a polycyclic fused ring structure, e.g., a naphthalene.

Another class of aromatic tertiary amines are the tetraaryldiamines. Desirable tetraaryldiamines include two diarylamino groups, such as indicated by Formula (C), linked through an arylene group. Useful tetraaryldiamines include those represented by Formula (D)

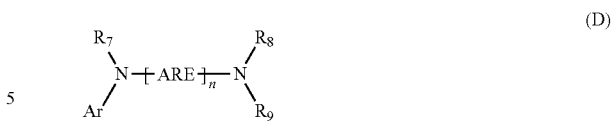

(D)

wherein:
each ARE is an independently selected arylene group, such as a phenylene or anthracene moiety;
n is an integer of from 1 to 4; and
Ar, R$_7$, R$_8$, and R$_9$ are independently selected aryl groups. In a typical embodiment, at least one of Ar, R$_7$, R$_8$, and R$_9$ is a polycyclic fused ring structure, e.g., a naphthalene.

Another class of the hole-transporting material comprises a material of formula (E):

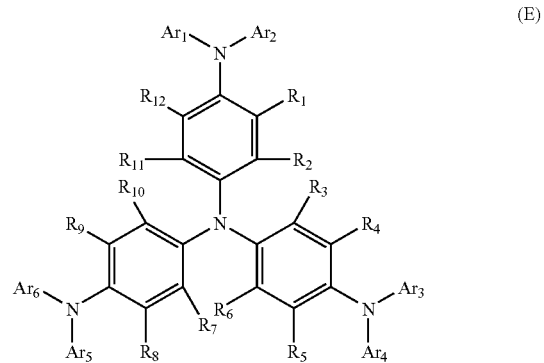

(E)

In formula (E), Ar$_1$-Ar$_6$ independently represent aromatic groups, for example, phenyl groups or tolyl groups;
R$_1$-R$_{12}$ independently represent hydrogen or independently selected substituent, for example an alkyl group containing from 1 to 4 carbon atoms, an aryl group, a substituted aryl group.

The various alkyl, alkylene, aryl, and arylene moieties of the foregoing structural Formulae (A), (B), (C), (D), and (E) can each in turn be substituted. Typical substituents include alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms, e.g. cyclopentyl, cyclohexyl, and cycloheptyl ring structures. The aryl and arylene moieties are typically phenyl and phenylene moieties.

The HTL is formed of a single or a mixture of aromatic tertiary amine compounds. Specifically, one can employ a triarylamine, such as a triarylamine satisfying the Formula (B), in combination with a tetraaryldiamine, such as indicated by Formula (D). When a triarylamine is employed in combination with a tetraaryldiamine, the latter is positioned as a layer interposed between the triarylamine and the electron injecting and transporting layer. Aromatic tertiary amines are useful as hole-injecting materials also. Illustrative of useful aromatic tertiary amines are the following:
1,1-bis(4-di-p-tolylaminophenyl)cyclohexane;
1,1-bis(4-di-p-tolylaminophenyl)-4-phenylcyclohexane;
1,5-bis[N-(1-naphthyl)-N-phenylamino]naphthalene;
2,6-bis(di-p-tolylamino)naphthalene;
2,6-bis[di-(1-naphthyl)amino]naphthalene;
2,6-bis[N-(1-naphthyl)-N-(2-naphthyl)amino]naphthalene;

2,6-bis[N,N-di(2-naphthyl)amine]fluorene;
4-(di-p-tolylamino)-4'-[4(di-p-tolylamino)-styryl]stilbene;
4,4'-bis(diphenylamino)quadriphenyl;
4,4''-bis[N-(1-anthryl)-N-phenylamino]-p-terphenyl;
4,4'-bis[N-(1-coronenyl)-N-phenylamino]biphenyl;
4,4'-bis[N-(1-naphthyl)-N-phenylamino]biphenyl (NPB);
4,4'-bis[N-(1-naphthyl)-N-(2-naphthyl)amino]biphenyl (TNB);
4,4''-bis[N-(1-naphthyl)-N-phenylamino]p-terphenyl;
4,4'-bis[N-(2-naphthacenyl)-N-phenylamino]biphenyl;
4,4'-bis[N-(2-naphthyl)-N-phenylamino]biphenyl;
4,4'-bis[N-(2-perylenyl)-N-phenylamino]biphenyl;
4,4'-bis[N-(2-phenanthryl)-N-phenylamino]biphenyl;
4,4'-bis[N-(2-pyrenyl)-N-phenylamino]biphenyl;
4,4'-bis[N-(3-acenaphthenyl)-N-phenylamino]biphenyl;
4,4'-bis[N-(3-methylphenyl)-N-phenylamino]biphenyl (TPD);
4,4'-bis[N-(8-fluoranthenyl)-N-phenylamino]biphenyl;
4,4'-bis[N-(9-anthryl)-N-phenylamino]biphenyl;
4,4'-bis{N-phenyl-N-[4-(1-naphthyl)-phenyl]amino}biphenyl;
4,4'-bis[N-phenyl-N-(2-pyrenyl)amino]biphenyl;
4,4',4''-tris[(3-methylphenyl)phenylamino]triphenylamine (m-TDATA);
Bis(4-dimethylamino-2-methylphenyl)-phenylmethane;
N-phenylcarbazole;
N,N'-bis[4-([1,1'-biphenyl]-4-ylphenylamino)phenyl]-N,N'-di-1-naphthalenyl-[1,1'-biphenyl]-4,4'-diamine;
N,N'-bis[4-(di-1-naphthalenylamino)phenyl]-N,N'-di-1-naphthalenyl-[1,1'-biphenyl]-4,4'-diamine;
N,N'-bis[4-[(3-methylphenyl)phenylamino]phenyl]-N,N'-diphenyl-[1,1'-biphenyl]-4,4'-diamine;
N,N'-bis[4-(diphenylamino)phenyl]-N',N'-diphenyl-[1,1'-biphenyl]-4,4'-diamine;
N,N'-di-1-naphthalenyl-N,N'-bis[4-(1-naphthalenylphenylamino)phenyl]-[1,1'-biphenyl]-4,4'-diamine;
N,N'-di-1-naphthalenyl-N,N'-bis[4-(2-naphthalenylphenylamino)phenyl]-[1,1'-biphenyl]-4,4'-diamine;
N,N,N-tri(p-tolyl)amine;
N,N,N',N'-tetra-p-tolyl-4-4'-diaminobiphenyl;
N,N,N',N'-tetraphenyl-4,4'-diaminobiphenyl;
N,N,N',N'-tetra-1-naphthyl-4,4'-diaminobiphenyl;
N,N,N',N'-tetra-2-naphthyl-4,4'-diaminobiphenyl; and
N,N,N',N'-tetra(2-naphthyl)-4,4''-diamino-p-terphenyl.

Another class of useful hole-transporting materials includes polycyclic aromatic compounds as described in EP 1 009 041. Tertiary aromatic amines with more than two amine groups can be used including oligomeric materials. In addition, polymeric hole-transporting materials are used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

The thickness of the HTL is in the range of from 5 nm to 200 nm, preferably, in the range of from 10 nm to 150 nm.

Exciton Blocking Layer (EBL)

An optional exciton- or electron-blocking layer may be present between the HTL and the LEL (not shown in FIG. 1). Some suitable examples of such blocking layers are described in U.S. App 20060134460 A1.

Light Emitting Layer

As more fully described in U.S. Pat. Nos. 4,769,292 and 5,935,721, the light-emitting layer(s) (LEL) 134 of the organic EL element shown in FIG. 1 comprises a luminescent, fluorescent or phosphorescent material where electroluminescence is produced as a result of electron-hole pair recombination in this region. The light-emitting layer can be comprised of a single material, but more commonly consists of non-electroluminescent compounds (generally referred to as the host) doped with an electroluminescent guest compound (generally referred to as the dopant) or compounds where light emission comes primarily from the electroluminescent compound and can be of any color. Electroluminescent compounds can be coated as 0.01 to 50% into the non-electroluminescent component material, but typically coated as 0.01 to 30% and more typically coated as 0.01 to 15% into the non-electroluminescent component. The thickness of the LEL can be any suitable thickness. It can be in the range of from 0.1 mm to 100 mm.

An important relationship for choosing a dye as a electroluminescent component is a comparison of the bandgap potential which is defined as the energy difference between the highest occupied molecular orbital and the lowest unoccupied molecular orbital of the molecule. For efficient energy transfer from the non-electroluminescent compound to the electroluminescent compound molecule, a necessary condition is that the band gap of the electroluminescent compound is smaller than that of the non-electroluminescent compound or compounds. Thus, the selection of an appropriate host material is based on its electronic characteristics relative to the electronic characteristics of the electroluminescent compound, which itself is chosen for the nature and efficiency of the light emitted. As described below, fluorescent and phosphorescent dopants typically have different electronic characteristics so that the most appropriate hosts for each may be different. However in some cases, the same host material can be useful for either type of dopant.

Non-electroluminescent compounds and emitting molecules known to be of use include, but are not limited to, those disclosed in U.S. Pat. Nos. 4,768,292, 5,141,671, 5,150,006, 5,151,629, 5,405,709, 5,484,922, 5,593,788, 5,645,948, 5,683,823, 5,755,999, 5,928,802, 5,935,720, 5,935,721, and 6,020,078.

a) Phosphorescent Light Emitting Layers

Suitable hosts for phosphorescent LELs should be selected so that transfer of a triplet exciton can occur efficiently from the host to the phosphorescent dopant(s) but cannot occur efficiently from the phosphorescent dopant(s) to the host. Therefore, it is highly desirable that the triplet energy of the host be higher than the triplet energies of phosphorescent dopant. Generally speaking, a large triplet energy implies a large optical band gap. However, the band gap of the host should not be chosen so large as to cause an unacceptable barrier to injection of holes into the fluorescent blue LEL and an unacceptable increase in the drive voltage of the OLED. The host in a phosphorescent LEL may include any of the aforementioned hole-transporting material used for the HTL 132, as long as it has a triplet energy higher than that of the phosphorescent dopant in the layer. The host used in a phosphorescent LEL can be the same as or different from the hole-transporting material used in the HTL 132. In some cases, the host in the phosphorescent LEL may also suitably include an electron-transporting material (it will be discussed thereafter), as long as it has a triplet energy higher than that of the phosphorescent dopant.

In addition to the aforementioned hole-transporting materials in the HTL 132, there are several other classes of hole-transporting materials suitable for use as the host in a phosphorescent LEL.

One desirable host comprises a hole-transporting material of formula (F):

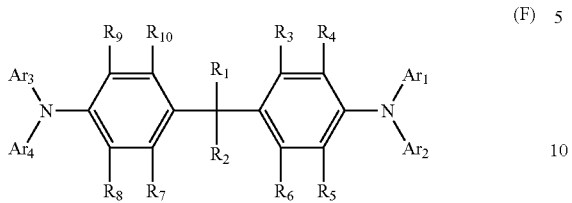

(F)

In formula (F), $R_1$ and $R_2$ represent substituents, provided that $R_1$ and $R_2$ can join to form a ring. For example, $R_1$ and $R_2$ can be methyl groups or join to form a cyclohexyl ring;

$Ar_1$-$Ar_4$ represent independently selected aromatic groups, for example phenyl groups or tolyl groups;

$R_3$-$R_{10}$ independently represent hydrogen, alkyl, substituted alkyl, aryl, substituted aryl group.

Examples of suitable materials include, but are not limited to:

1,1-Bis(4-(N,N-di-p-tolylamino)phenyl)cyclohexane (TAPC);
1,1-Bis(4-(N,N-di-p-tolylamino)phenyl)cyclopentane;
4,4'-(9H-fluoren-9-ylidene)bis[N,N-bis(4-methylphenyl)-benzenamine;
1,1-Bis(4-(N,N-di-p-tolylamino)phenyl)-4-phenylcyclohexane;
1,1-Bis(4-(N,N-di-p-tolylamino)phenyl)-4-methylcyclohexane;
1,1-Bis(4-(N,N-di-p-tolylamino)phenyl)-3-phenylpropane;
Bis[4-(N,N-diethylamino)-2-methylphenyl](4-methylpenyl)methane;
Bis[4-(N,N-diethylamino)-2-methylphenyl](4-methylphenyl)ethane;
4-(4-Diethylaminophenyl)triphenylmethane;
4,4'-Bis(4-diethylaminophenyl)diphenylmethane.

A useful class of triarylamines suitable for use as the host includes carbazole derivatives such as those represented by formula (G):

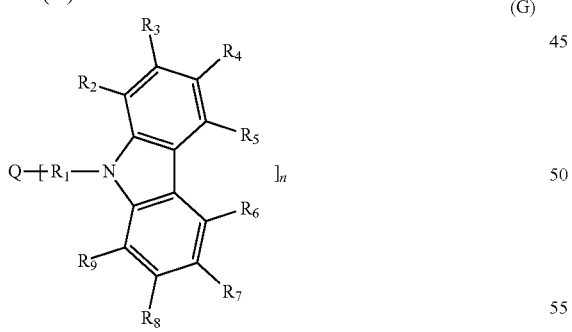

(G)

In formula (G), Q independently represents nitrogen, carbon, an aryl group, or substituted aryl group, preferably a phenyl group;

$R_1$ is preferably an aryl or substituted aryl group, and more preferably a phenyl group, substituted phenyl, biphenyl, substituted biphenyl group;

$R_2$ through $R_7$ are independently hydrogen, alkyl, phenyl or substituted phenyl group, aryl amine, carbazole, or substituted carbazole;

and n is selected from 1 to 4.

Another useful class of carbazoles satisfying structural formula (G) is represented by formula (H):

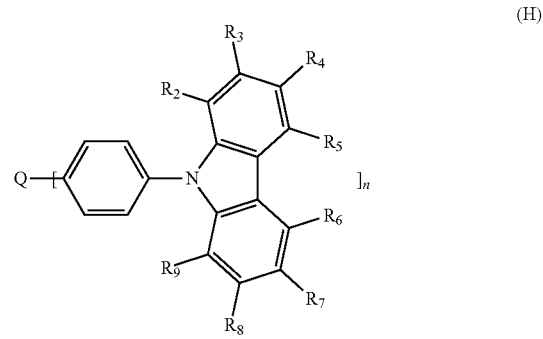

(H)

wherein:
n is an integer from 1 to 4;
Q is nitrogen, carbon, an aryl, or substituted aryl;
$R_2$ through $R_7$ are independently hydrogen, an alkyl group, phenyl or substituted phenyl, an aryl amine, a carbazole and substituted carbazole.

Illustrative of useful substituted carbazoles are the following:

4-(9H-carbazol-9-yl)-N,N-bis[4-(9H-carbazol-9-yl)phenyl]-benzenamine (TCTA);
4-(3-phenyl-9H-carbazol-9-yl)-N,N-bis[4(3-phenyl-9H-carbazol-9-yl)phenyl]-benzenamine;
9,9'-[5'-[4-(9H-carbazol-9-yl)phenyl][1,1':3',1"-terphenyl]-4,4"-diyl]bis-9H-carbazole
9,9'-(2,2'-dimethyl[1,1'-biphenyl]-4,4'-diyl)bis-9H-carbazole (CDBP);
9,9'-[1,1'-biphenyl]-4,4'-diyl)bis-9H-carbazole (CBP);
9,9'-(1,3-phenylene)bis-9H-carbazole (mCP);
9,9'-(1,4-phenylene)bis-9H-carbazole;
9,9',9"-(1,3,5-benzenetriyl)tris-9H-carbazole;
9,9'-(1,4-phenylene)bis[N,N,N',N'-tetraphenyl-9H-carbazole-3,6-diamine;
9-[4-(9H-carbazol-9-yl)phenyl]-N,N-diphenyl-9H-carbazol-3-amine;
9,9'-(1,4-phenylene)bis[N,N-diphenyl-9H-carbazol-3-amine;
9-[4-(9H-carbazol-9-yl)phenyl]-N,N,N',N'-tetraphenyl-9H-carbazole-3,6-diamine.

The above classes of hosts suitable for phosphorescent LELs may also be used as hosts in fluorescent LELs as well.

Suitable phosphorescent dopants for use in a phosphorescent LEL can be selected from the phosphorescent materials described by formula (J) below:

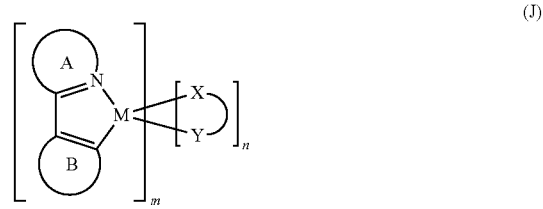

(J)

wherein:
A is a substituted or unsubstituted heterocyclic ring containing at least one nitrogen atom;

B is a substituted or unsubstituted aromatic or heteroaromatic ring, or ring containing a vinyl carbon bonded to M;

X—Y is an anionic bidentate ligand;

m is an integer from 1 to 3 and n in an integer from 0 to 2 such that m+n=3 for M=Rh or Ir; or m is an integer from 1 to 2 and n in an integer from 0 to 1 such that m+n=2 for M=Pt or Pd.

Compounds according to formula (J) may be referred to as C,N— (or C^N-)cyclometallated complexes to indicate that the central metal atom is contained in a cyclic unit formed by bonding the metal atom to carbon and nitrogen atoms of one or more ligands. Examples of heterocyclic ring A in formula (J) include substituted or unsubstituted pyridine, quinoline, isoquinoline, pyrimidine, indole, indazole, thiazole, and oxazole rings. Examples of ring B in formula (J) include substituted or unsubstituted phenyl, napthyl, thienyl, benzothienyl, furanyl rings. Ring B in formula (J) may also be a N-containing ring such as pyridine, with the proviso that the N-containing ring bonds to M through a C atom as shown in formula (J) and not the N atom.

An example of a tris-C,N-cyclometallated complex according to formula (J) with m=3 and n=0 is tris(2-phenyl-pyridinato-N,C$^{2'}$-)Iridium (III), shown below in stereodiagrams as facial (fac-) or meridional (mer-) isomers.

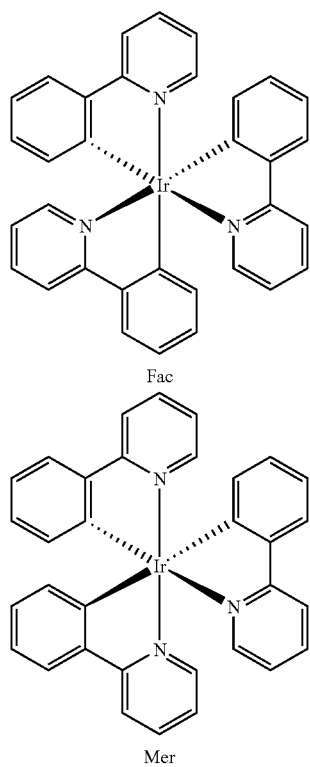

Fac

Mer

Generally, facial isomers are preferred since they are often found to have higher phosphorescent quantum yields than the meridional isomers. Additional examples of tris-C,N-cyclometallated phosphorescent materials according to formula (J) are tris(2-(4'-methylphenyl)pyridinato-N,C$^{2'}$)Iridium(III), tris(3-phenylisoquinolinato-N,C$^{2'}$)Iridium(III), tris(2-phenylquinolinato-N,C$^{2'}$)Iridium(III), tris(1-phenylisoquinolinato-N,C$^{2'}$)Iridium(III), tris(1-(4'-methylphenyl)isoquinolinato-N,C$^{2'}$)Iridium(III), tris(2-(4',6'-diflourophenyl)-pyridinato-N,C$^{2'}$)Iridium(III), tris(2-((5'-phenyl)-phenyl)pyridinato-N,C$^{2'}$)Iridium(III), tris(2-(2'-benzothienyl)pyridinato-N,C$^{3'}$)Iridium(III), tris(2-phenyl-3,3'dimethyl)indolato-N,C$^{2'}$)Ir(III), tris(1-phenyl-1H-indazolato-N,C$^{2'}$)(III).

Of these, tris(1-phenylisoquinoline)iridium (III) (also referred to as Ir(piq)$_3$) and tris(2-phenylpyridine)iridium (also referred to as Ir(ppy)$_3$) are particularly suitable for this invention.

Tris-C,N-cyclometallated phosphorescent materials also include compounds according to formula (J) wherein the monoanionic bidentate ligand X—Y is another C,N-cyclometallating ligand. Examples include bis(1-phenylisoquinolinato-N,C$^{2'}$)(2-phenylpyridinato-N,C$^{2'}$)Iridium(III) and bis(2-phenylpyridinato-N,C$^{2'}$)(1-phenylisoquinolinato-N,C$^{2'}$)Iridium(III). Synthesis of such tris-C,N-cyclometallated complexes containing two different C,N-cyclometallating ligands may be conveniently synthesized by the following steps. First, a bis-C,N-cyclometallated diiridium dihalide complex (or analogous dirhodium complex) is made according to the method of Nonoyama (Bull. Chem. Soc. Jpn., 47, 767 (1974)). Secondly, a zinc complex of the second, dissimilar C,N-cyclometallating ligand is prepared by reaction of a zinc halide with a lithium complex or Grignard reagent of the cyclometallating ligand. Third, the thus formed zinc complex of the second C,N-cyclometallating ligand is reacted with the previously obtained bis-C,N-cyclometallated diiridium dihalide complex to form a tris-C,N-cyclometallated complex containing the two different C,N-cyclometallating ligands. Desirably, the thus obtained tris-C,N-cyclometallated complex containing the two different C,N-cyclometallating ligands may be converted to an isomer wherein the C atoms bonded to the metal (e.g. Ir) are all mutually cis by heating in a suitable solvent such as dimethyl sulfoxide.

Suitable phosphorescent materials according to formula (J) may in addition to the C,N-cyclometallating ligand(s) also contain monoanionic bidentate ligand(s) X—Y that are not C,N-cyclometallating. Common examples are beta-diketonates such as acetylacetonate, and Schiff bases such as picolinate. Examples of such mixed ligand complexes according to formula (J) include bis(2-phenylpyridinato-N,C$^{2'}$)Iridium (III)(acetylacetonate), bis(2-(2'-benzothienyl)pyridinato-N,C$^{3'}$)Iridium(III)(acetylacetonate), and bis(2-(4',6'-dilourophenyl)-pyridinato-N,C$^{2'}$)Iridium(III)(picolinate).

Other important phosphorescent materials according to formula (J) include C,N-cyclometallated Pt(II) complexes such as cis-bis(2-phenylpyridinato-N,C$^{2'}$)platinum(II), cis-bis(2-(2'-thienyl)pyridinato-N,C$^{3'}$)platinum(II), cis-bis(2-(2'-thienyl)quinolinato-N,C$^{5'}$)platinum(II), or (2-(4',6'-diluorophenyl)pyridinato-N,C$^{2'}$)platinum(II) (acetylacetonate).

The emission wavelengths (color) of C,N-cyclometallated phosphorescent materials according to formula (J) are governed principally by the lowest energy optical transition of the complex and hence by the choice of the C,N-cyclometallating ligand. For example, 2-phenyl-pyridinato-N,C$^{2'}$ complexes are typically green emissive while 1-phenyl-isoquinolinolato-N,C$^{2'}$ complexes are typically red emissive. In the case of complexes having more than one C,N-cyclometallating ligand, the emission will be that of the ligand having the property of longest wavelength emission. Emission wavelengths may be further shifted by the effects of substituent groups on the C,N-cyclometallating ligands. For example, substitution of electron donating groups at appropriate positions on the N-containing ring A or electron accepting groups on the C-containing ring B tend to blue-shift the emission relative to the unsubstituted C,N-cyclometallated ligand complex. Selecting a monodentate anionic ligand X,Y in formula (J) having more electron accepting properties also tends to blue-shift the emission of a C,N-cyclometallated ligand complex. Examples of complexes having both monoanionic bidentate ligands possessing electron accepting properties and electron accepting substituent groups on the C-containing ring B include bis(2-(4',6'-difluorophenyl)-pyridinato-N,C²')iridium(III)(picolinate) and bis(2-(4',6'-difluorophenyl)-pyridinato-N,C²')iridium(III)(tetrakis(1-pyrazolyl)borate).

The central metal atom in phosphorescent materials according to formula (J) may be Rh or Ir (m+n=3) and Pd or Pt (m+n=2). Preferred metal atoms are Ir and Pt since they tend to give higher phosphorescent quantum efficiencies according to the stronger spin-orbit coupling interactions generally obtained with elements in the third transition series.

In addition to bidentate C,N-cyclometallating complexes represented by formula (J), many suitable phosphorescent materials contain multidentate C,N-cyclometallating ligands. Phosphorescent materials having tridentate ligands suitable for use in the present invention are disclosed in U.S. Pat. No. 6,824,895 B1 and references therein, incorporated in their entirety herein by reference. Phosphorescent materials having tetradentate ligands suitable for use in the present invention are described by the following formulae:

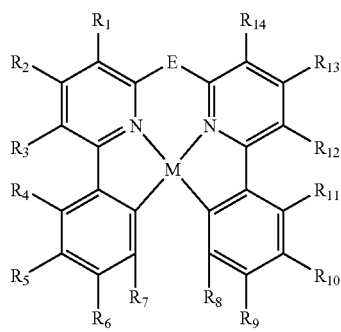

(K)

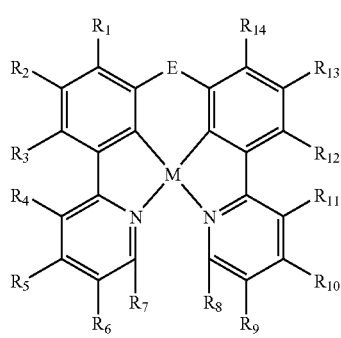

(L)

wherein:
M is Pt or Pd;
$R^1$-$R^7$ represent hydrogen or independently selected substituents, provided that $R^1$ and $R^2$, $R^2$ and $R^3$, $R^3$ and $R^4$, $R^4$ and $R^5$, $R^5$ and $R^6$, as well as $R^6$ and $R^7$ may join to form a ring group;

$R^8$-$R^{14}$ represent hydrogen or independently selected substituents, provided that $R^8$ and $R^9$, $R^9$ and $R^{10}$, $R^{10}$ and $R^{11}$, $R^{11}$ and $R^{12}$, $R^{12}$ and $R^{13}$, as well as $R^{13}$ and $R^{14}$, may join to form a ring group;

E represents a bridging group selected from the following:

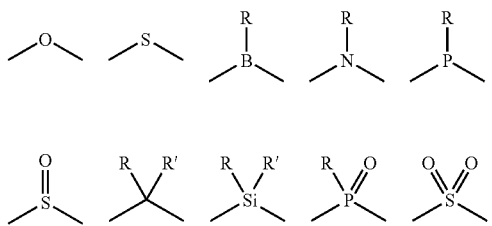

wherein:
R and R' represent hydrogen or independently selected substituents; provided R and R' may combine to form a ring group.

One desirable tetradentate C,N-cyclometallated phosphorescent material suitable for use in as the phosphorescent dopant is represented by the following formula:

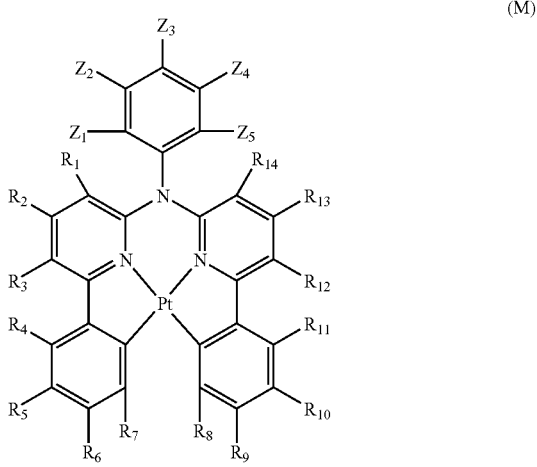

(M)

wherein:
$R^1$-$R^7$ represent hydrogen or independently selected substituents, provided that $R^1$ and $R^2$, $R^2$ and $R^3$, $R^3$ and $R^4$, $R^4$ and $R^5$, $R^5$ and $R^6$, as well as $R^6$ and $R^7$ may combine to form a ring group;

$R^8$-$R^{14}$ represent hydrogen or independently selected substituents, provided that $R^8$ and $R^9$, $R^9$ and $R^{10}$, $R^{10}$ and $R^{11}$, $R^{11}$ and $R^{12}$, $R^{12}$ and $R^{13}$, as well as $R^{13}$ and $R^{14}$ may combine to form a ring group;

$Z^1$-$Z^5$ represent hydrogen or independently selected substituents, provided that $Z^1$ and $Z^2$, $Z^2$ and $Z^3$, $Z^3$ and $Z^4$, as well as $Z^4$ and $Z^5$ may combine to form a ring group.

Specific examples of phosphorescent materials having tetradentate C,N-cyclometallating ligands suitable for use in the present invention include compounds (M-1), (M-2) and (M-3) represented below.

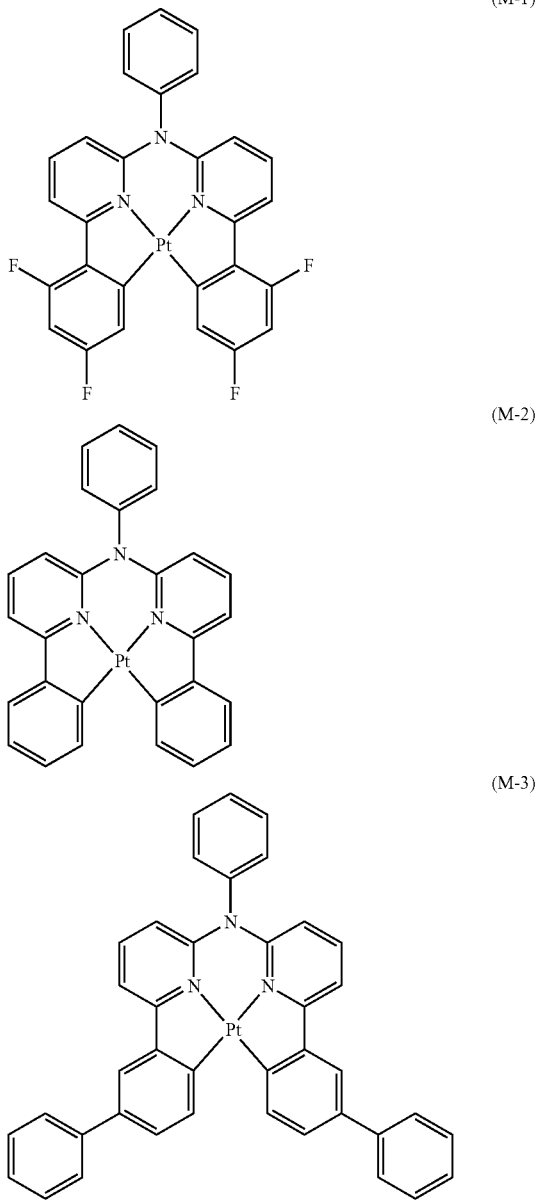

(M-1)

(M-2)

(M-3)

Phosphorescent materials having tetradentate C,N-cyclometallating ligands may be synthesized by reacting the tetradentate C,N-cyclometallating ligand with a salt of the desired metal, such as $K_2PtCl_4$, in a proper organic solvent such as glacial acetic acid to form the phosphorescent material having tetradentate C,N-cyclometallating ligands. A tetraalkylammonium salt such as tetrabutylammonium chloride can be used as a phase transfer catalyst to accelerate the reaction.

Other phosphorescent materials that do not involve C,N-cyclometallating ligands are known. Phosphorescent complexes of Pt(II), Ir(I), and Rh(I) with maleonitriledithiolate have been reported (Johnson et al., *J. Am. Chem. Soc.,* 105, 1795 (1983)). Re(I) tricarbonyl diimine complexes are also known to be highly phosphorescent (Wrighton and Morse, *J. Am. Chem. Soc.,* 96, 998 (1974); Stufkens, *Comments Inorg. Chem.,* 13, 359 (1992); Yam, *Chem. Commun.,* 789 (2001)). Os(II) complexes containing a combination of ligands including cyano ligands and bipyridyl or phenanthroline ligands have also been demonstrated in a polymer OLED (Ma et al., *Synthetic Metals,* 94, 245 (1998)).

Porphyrin complexes such as 2,3,7,8,12,13,17,18-octaethyl-21H,23H-porphine platinum(II) are also useful phosphorescent dopant.

Still other examples of useful phosphorescent materials include coordination complexes of the trivalent lanthanides such as $Tb^{3+}$ and $Eu^{3+}$ (Kido et al., *Chem. Lett.,* 657 (1990); *J. Alloys and Compounds,* 192, 30 (1993); *Jpn. J. Appl. Phys.,* 35, L394 (1996) and *Appl. Phys. Lett.,* 65, 2124 (1994)).

The phosphorescent dopant in a phosphorescent LEL is typically present in an amount of from 1 to 20% by volume of the LEL, and conveniently from 2 to 8% by volume of the LEL. In some embodiments, the phosphorescent dopant(s) may be attached to one or more host materials. The host materials may further be polymers. The phosphorescent dopant in the first phosphorescent light-emitting layer is selected from green and red phosphorescent materials.

The thickness of a phosphorescent LEL is greater than 0.5 nm, preferably, in the range of from 1.0 nm to 40 nm.

b) Fluorescent Light Emitting Layers

Although the term "fluorescent" is commonly used to describe any light-emitting material, in this case it refers to a material that emits light from a singlet excited state. Fluorescent materials may be used in the same layer as the phosphorescent material, in adjacent layers, in adjacent pixels, or any combination. Care must be taken not to select materials that will adversely affect the performance of the phosphorescent materials of this invention. One skilled in the art will understand that concentrations and triplet energies of materials in the same layer as the phosphorescent material or in an adjacent layer must be appropriately set so as to prevent unwanted quenching of the phosphorescence.

Typically, a fluorescent LEL includes at least one host and at least one fluorescent dopant. The host may be a hole-transporting material or any of the suitable hosts for phosphorescent dopants as defined above or may be an electron-transporting material as defined below.

The dopant is typically chosen from highly fluorescent dyes, e.g., transition metal complexes as described in WO 98/55561 A1, WO 00/18851 A1, WO 00/57676 A1, and WO 00/70655.

Useful fluorescent dopants include, but are not limited to, derivatives of anthracene, tetracene, xanthene, perylene, phenylene, dicyanomethylenepyran compounds, thiopyran compounds, polymethine compounds, pyrylium and thiapyrylium compounds, arylpyrene compounds, arylenevinylene compounds, periflanthene derivatives, indenoperylene derivatives, bis(azinyl)amine boron compounds, bis(azinyl) methane boron compounds, distryrylbenzene derivatives, distyrylbiphenyl derivatives, distyrylamine derivatives and carbostyryl compounds.

Some fluorescent emitting materials include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrylium and thiapyrylium compounds, fluorene derivatives, periflanthene derivatives, indenoperylene derivatives, bis(azinyl)amine boron compounds, bis(azinyl)methane compounds (as described in U.S. Pat. No. 5,121,029) and carbostyryl compounds. Illustrative examples of useful materials include, but are not limited to, the following:

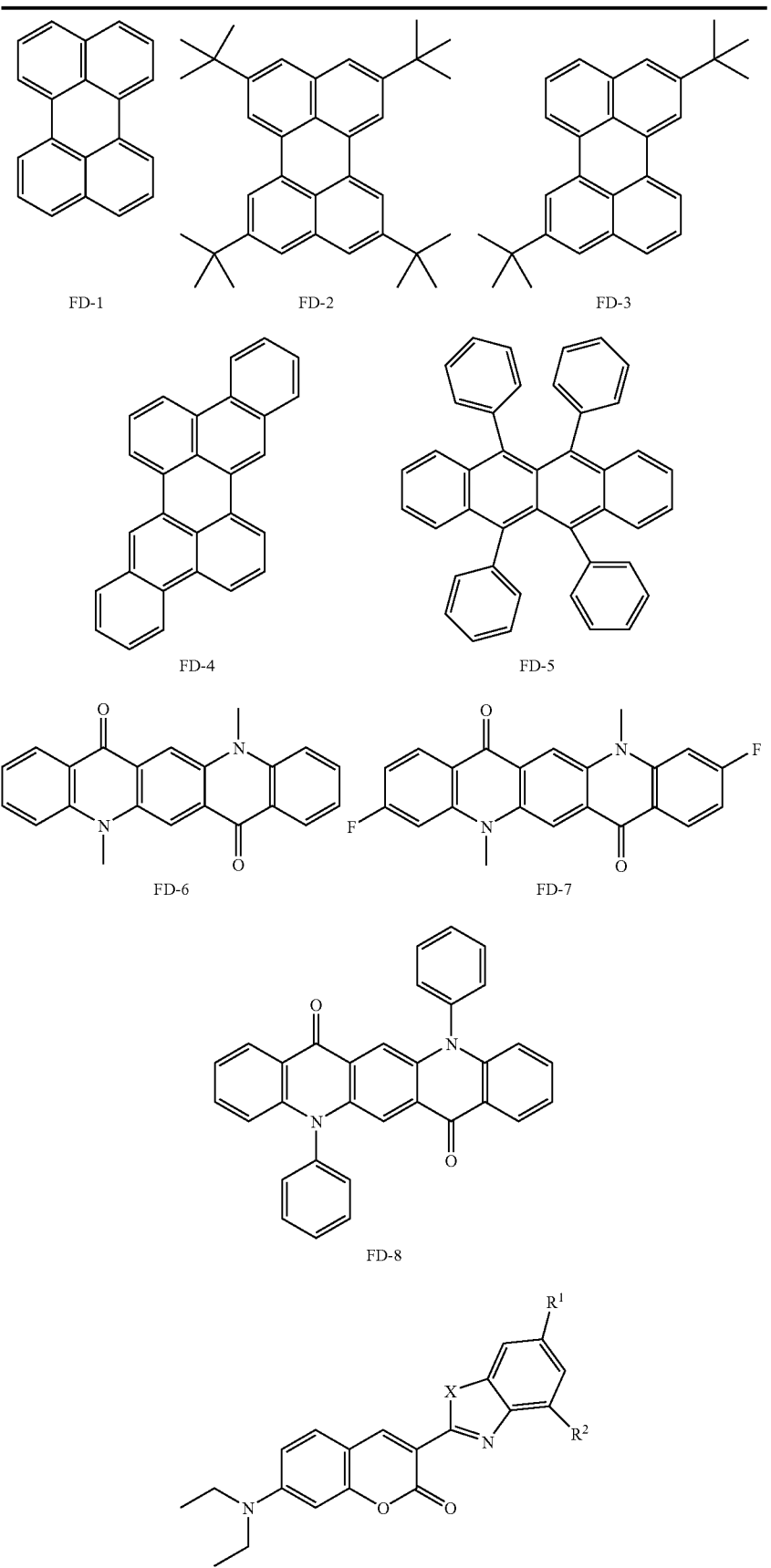

-continued

|  | X | R1 | R2 |
|---|---|---|---|
| FD-9 | O | H | H |
| FD-10 | O | H | Methyl |
| ED-11 | O | Methyl | H |
| FD-12 | O | Methyl | Methyl |
| FD-13 | O | H | t-butyl |
| FD-14 | O | t-butyl | H |
| FD-15 | O | t-butyl | t-butyl |
| FD-16 | S | H | H |
| FD-17 | S | H | Methyl |
| FD-18 | S | Methyl | H |
| FD-19 | S | Methyl | Methyl |
| FD-20 | S | H | t-butyl |
| FD-21 | S | t-butyl | H |
| FD-22 | S | t-butyl | t-butyl |

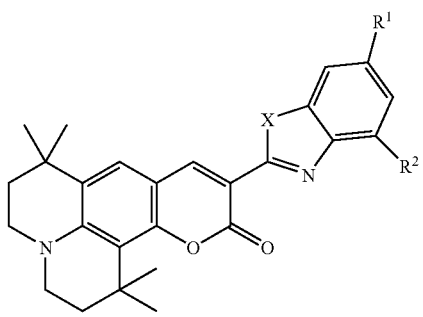

|  | X | R1 | R2 |
|---|---|---|---|
| FD-13 | O | H | H |
| FD-24 | O | H | Methyl |
| ED-25 | O | Methyl | H |
| FD-26 | O | Methyl | Methyl |
| FD-27 | O | H | t-butyl |
| FD-28 | O | t-butyl | H |
| FD-29 | O | t-butyl | t-butyl |
| FD-30 | S | H | H |
| FD-31 | S | H | Methyl |
| FD-32 | S | Methyl | H |
| FD-33 | S | Methyl | Methyl |
| FD-34 | S | H | t-butyl |
| FD-35 | S | t-butyl | H |
| FD-36 | S | t-butyl | t-butyl |

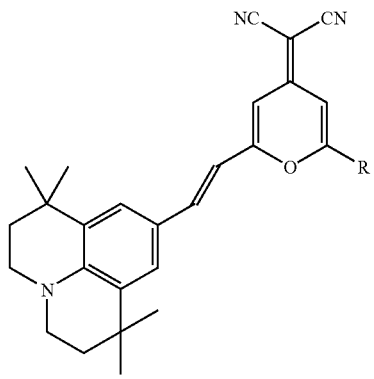

|  | R |
|---|---|
| FD-37 | phenyl |
| FD-38 | methyl |
| FD-39 | t-butyl |
| FD-40 | mesityl |

-continued
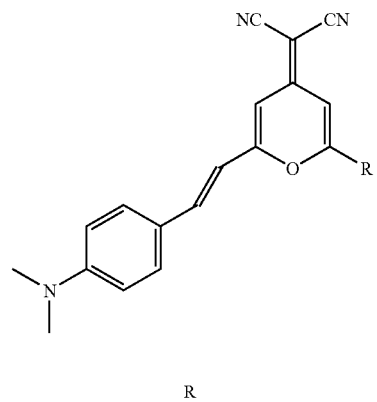
| | R |
|---|---|
| FD-41 | phenyl |
| FD-42 | methyl |
| FD-43 | t-butyl |
| FD-44 | mesityl |
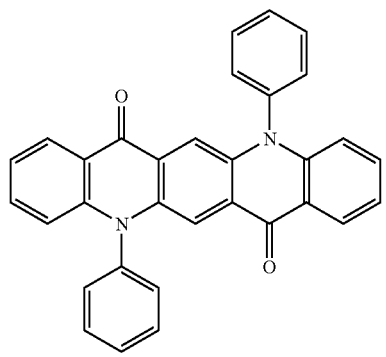
FD-45
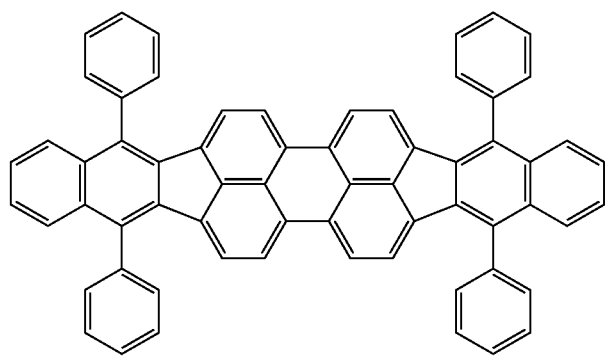
FD-46

-continued
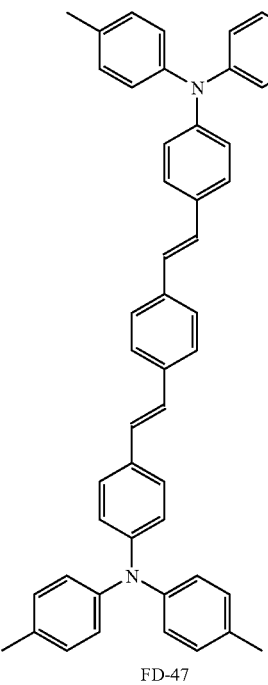
FD-47
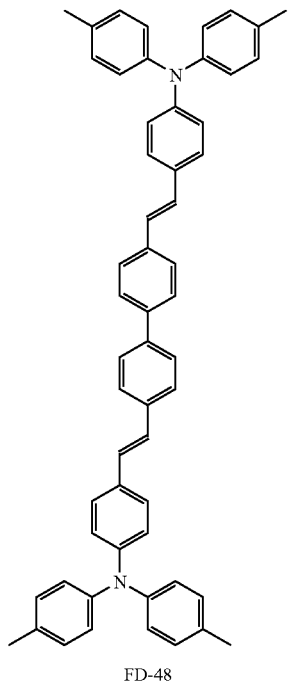
FD-48
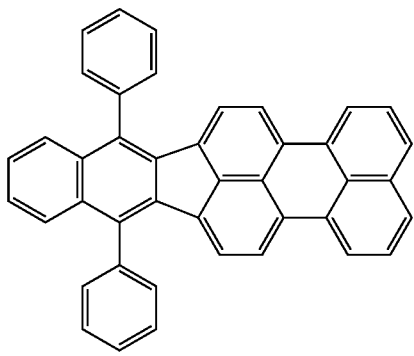
FD-49
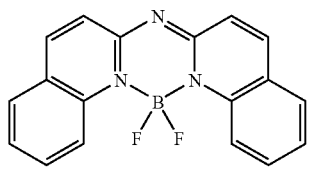
FD-50
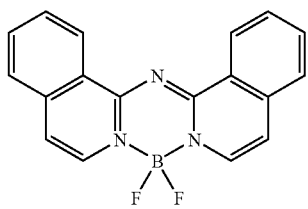
FD-51
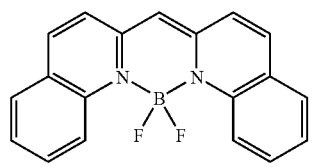
FD-52

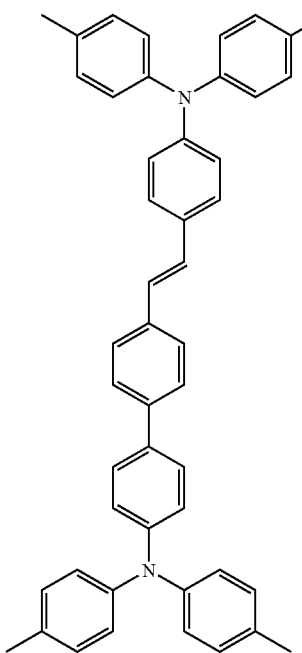
FD-53
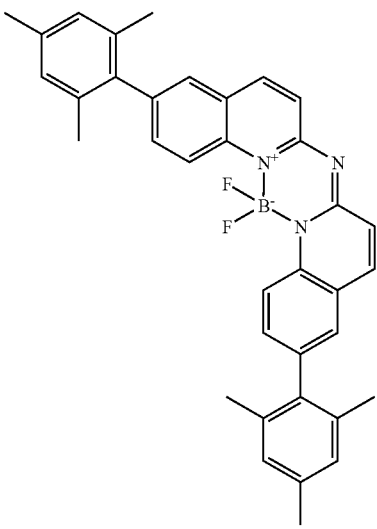
FD-54
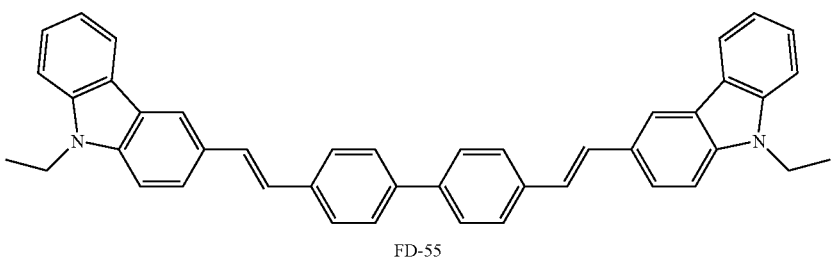
FD-55
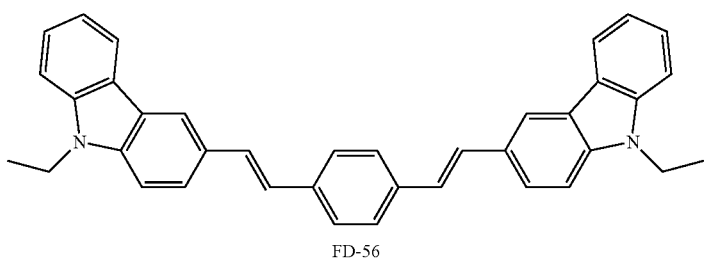
FD-56

Preferred fluorescent blue dopants may be found in Chen, Shi, and Tang, "Recent Developments in Molecular Organic Electroluminescent Materials," *Macromol. Symp.* 125, 1 (1997) and the references cited therein; Hung and Chen, "Recent Progress of Molecular Organic Electroluminescent Materials and Devices," *Mat. Sci. and Eng.* R39, 143 (2002) and the references cited therein.

A particularly preferred class of blue-emitting fluorescent dopants is represented by Formula (N), known as a bis (azinyl0amine borane complex, and is described in U.S. Pat. No. 6,661,023.

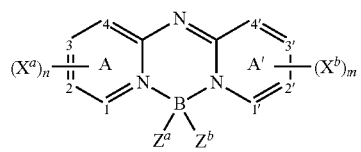

Formula (N)

wherein:
A and A' represent independent azine ring systems corresponding to 6-membered aromatic ring systems containing at least one nitrogen;

each $X^a$ and $X^b$ is an independently selected substituent, two of which may join to form a fused ring to A or A';

m and n are independently 0 to 4;

$Z^a$ and $Z^b$ are independently selected substituents; and 1, 2, 3, 4, 1', 2', 3', and 4' are independently selected as either carbon or nitrogen atoms.

Desirably, the azine rings are either quinolinyl or isoquinolinyl rings such that 1, 2, 3, 4, 1', 2', 3', and 4' are all carbon; m and n are equal to or greater than 2; and $X^a$ and $X^b$ represent at least two carbon substituents which join to form an aromatic ring. Desirably, $Z^a$ and $Z^b$ are fluorine atoms.

Preferred embodiments further include devices where the two fused ring systems are quinoline or isoquinoline systems; the aryl or heterocyclic substituent is a phenyl group; there are present at least two $X^a$ groups and two $X^b$ groups which join to form a 6-6 fused ring, the fused ring systems are fused at the 1-2, 3-4, 1'-2', or 3'-4' positions, respectively; one or both of the fused rings is substituted by a phenyl group; and where the dopant is depicted in Formulae (N-a), (N-b), or (N-c).

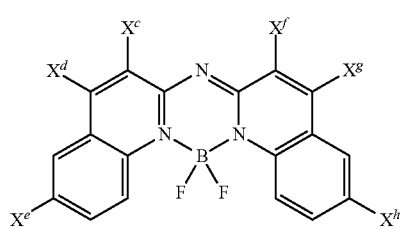

Formula (N-a)

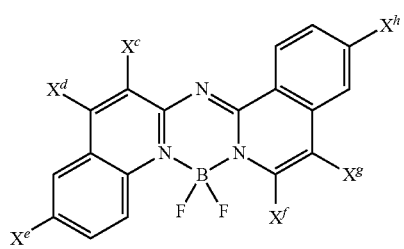

Formula (N-b)

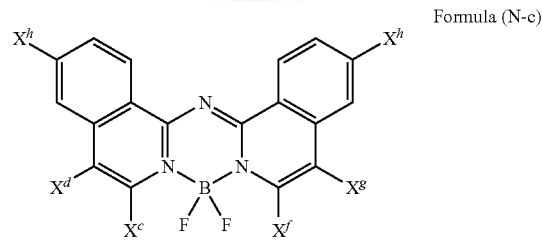

Formula (N-c)

wherein:
each $X^c$, $X^d$, $X^e$, $X^f$, $X^g$, and $X^h$ is hydrogen or an independently selected substituent, one of which must be an aryl or heterocyclic group.

Desirably, the azine rings are either quinolinyl or isoquinolinyl rings such that 1, 2, 3, 4, 1', 2', 3', and 4' are all carbon; m and n are equal to or greater than 2; and $X^a$ and $X^b$ represent at least two carbon substituents which join to form an aromatic ring, and one is an aryl or substituted aryl group. Desirably, $Z^a$ and $Z^b$ are fluorine atoms.

Of these, compound FD-54 is particularly useful.

Coumarins represent a useful class of green-emitting dopants as described by Tang et al. in U.S. Pat. Nos. 4,769,292 and 6,020,078. Green dopants or light-emitting materials can be coated as 0.01 to 50% by weight into the host material, but typically coated as 0.01 to 30% and more typically coated as 0.01 to 15% by weight into the host material. Examples of useful green-emitting coumarins include C545T and C545TB. Quinacridones represent another useful class of green-emitting dopants. Useful quinacridones are described in U.S. Pat. No. 5,593,788, publication JP 09-13026A, and commonly assigned U.S. patent application Ser. No. 10/184,356 filed Jun. 27, 2002 by Lelia Cosimbescu, entitled "Device Containing Green Organic Light-Emitting Diode", the disclosure of which is incorporated herein.

Examples of particularly useful green-emitting quinacridones are FD-7 and FD-8.

Formula (N-d) below represents another class of green-emitting dopants useful in the invention.

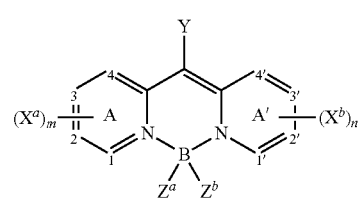

Formula (N-d)

wherein:
A and A' represent independent azine ring systems corresponding to 6-membered aromatic ring systems containing at least one nitrogen;

each $X^a$ and $X^b$ is an independently selected substituent, two of which may join to form a fused ring to A or A';

m and n are independently 0 to 4;

Y is H or a substituent;

$Z^a$ and $Z^b$ are independently selected substituents; and 1, 2, 3, 4, 1', 2', 3', and 4' are independently selected as either carbon or nitrogen atoms.

In the device, 1, 2, 3, 4, 1', 2', 3', and 4' are conveniently all carbon atoms. The device may desirably contain at least one or both of ring A or A' that contains substituents joined to form a fused ring. In one useful embodiment, there is present at least one $X^a$ or $X^b$ group selected from the group consisting of halide and alkyl, aryl, alkoxy, and aryloxy groups. In another embodiment, there is present a $Z^a$ and $Z^b$ group independently selected from the group consisting of fluorine and alkyl, aryl, alkoxy and aryloxy groups. A desirable embodiment is where $Z^a$ and $Z^b$ are F. Y is suitably hydrogen or a substituent such as an aryl, or heterocyclic group.

The emission wavelength of these compounds may be adjusted to some extent by appropriate substitution around the central bis(azinyl)methene boron group to meet a color aim, namely green. Some examples of useful material are FD-50, FD-51 and FD-52.

Naphthacenes and derivatives thereof also represent a useful class of emitting dopants, which can also be used as stabilizers. These dopant materials can be coated as 0.01 to 50% by weight into the host material, but typically coated as 0.01 to 30% and more typically coated as 0.01 to 15% by weight into the host material. Naphthacene derivative YD-1 (t-BuDPN) below, is an example of a dopant material used as a stabilizer.

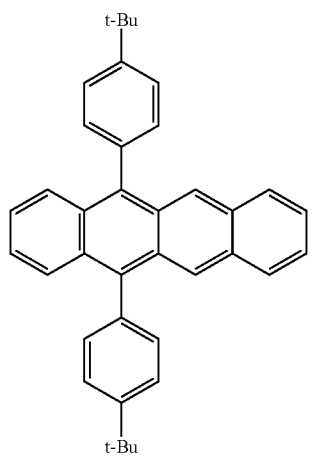

YD-1

Some examples of this class of materials are also suitable as host materials as well as dopants. For example, see U.S. Pat. No. 6,773,832 or U.S. Pat. No. 6,720,092. A specific example of this would be rubrene (FD-5).

Another class of useful dopants are perylene derivatives; for example see U.S. Pat. No. 6,689,493. A specific example is FD-46.

Metal complexes of 8-hydroxyquinoline and similar derivatives (Formula O) constitute one class of useful non-electroluminescent host compounds capable of supporting electroluminescence, and are particularly suitable for light emission of wavelengths longer than 500 nm, e.g., green, yellow, orange, and red.

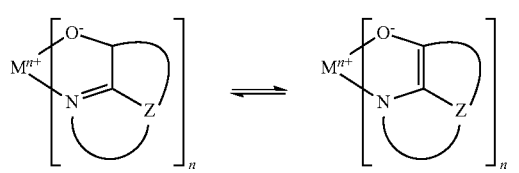

(O)

wherein:
M represents a metal;
n is an integer of from 1 to 4; and
Z independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; an earth metal, such as aluminum or gallium, or a transition metal such as zinc or zirconium. Generally any monovalent, divalent, trivalent, or tetravalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:
O-1: Aluminum trisoxine[alias, tris(8-quinolinolato)aluminum(III)]
O-2: Magnesium bisoxine[alias, bis(8-quinolinolato)magnesium(II)]
O-3: Bis[benzo{f}-8-quinolinolato]zinc (II)
O-4: Bis(2-methyl-8-quinolinolato)aluminum(III)-μ-oxo-bis(2-methyl-8-quinolinolato)aluminum(III)
O-5: Indium trisoxine[alias, tris(8-quinolinolato)indium]
O-6: Aluminum tris(5-methyloxine)[alias, tris(5-methyl-8-quinolinolato)aluminum(III)]
O-7: Lithium oxine[alias, (8-quinolinolato)lithium(I)]
O-8: Gallium oxine[alias, tris(8-quinolinolato)gallium (III)]
O-9: Zirconium oxine[alias, tetra(8-quinolinolato)zirconium(IV)]
O-10: Bis(2-methyl-8-quinolinato)-4-phenylphenolatoaluminum (III)
O-11: Tris(2-methyl-8-quinolinolato)aluminum(III)[alia, ALMQ]

Anthracene derivatives according to Formula (P—H), similar to previously described for use in the HTL according to Formula (P), are also useful host materials in the LEL:

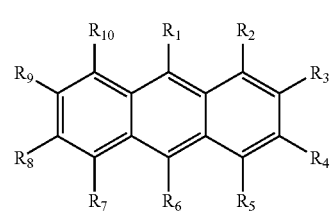

(P-H)

wherein:
$R_1$-$R_{10}$ are independently chosen from hydrogen, alkyl groups from 1-24 carbon atoms or aromatic groups from 1-24 carbon atoms. Particularly preferred are compounds where $R_1$ and $R_6$ are phenyl, biphenyl or napthyl, $R_3$ is phenyl, substituted phenyl or napthyl and $R_2$, $R_4$, $R_5$, $R_7$-$R_{10}$ are all hydrogen.

Spacer Layer

Spacer layers, when present, are located in direct contact to a LEL. They may be located on either the anode or cathode, or even both sides of the LEL. They typically do not contain any light-emissive dopants. One or more materials may be used and could be either a hole-transporting material as defined above or an electron-transporting material as defined below. If located next to a phosphorescent LEL, the material in the spacer layer should have higher triplet energy than that of the phosphorescent dopant in the LEL. Most desirably, the material in the spacer layer will be the same as used as the host in the adjacent LEL. Thus, any of the host materials described as also suitable for use in a spacer layer. The spacer layer should be in; at least 0.1 nm, but preferably in the range of from 1.0 nm to 20 nm.

Hole-Blocking Layer (HBL)

When a LEL containing a phosphorescent emitter is present, it is desirable to locate a hole-blocking layer 135 between the electron-transporting layer 136 and the light-emitting layer 134 to help confine the excitons and recombination events to the LEL. In this case, there should be an energy barrier for hole migration from co-hosts into the hole-blocking layer, while electrons should pass readily from the hole-blocking layer into the light-emitting layer comprising co-host materials and a phosphorescent emitter. It is further desirable that the triplet energy of the hole-blocking material be greater than that of the phosphorescent material. Suitable hole-blocking materials are described in WO 00/70655A2, WO 01/41512 and WO 01/93642 A1. Two examples of useful hole-blocking materials are bathocuproine (BCP) and bis(2-methyl-8-quinolinolato)(4-phenylphenolato)aluminum(III) (BAlq). Metal complexes other than BAlq are also known to block holes and excitons as described in US 20030068528. When a hole-blocking layer is used, its thickness can be between 2 and 100 nm and suitably between 5 and 10 nm.

Electron Transporting Layer

The invention contains an ETL as generally described above. However, there may be more than one ETL and the following describes materials and designs suitable for an ETL. The electron-transporting layer may be composed only of the ETM or may be a mixture of the ETM with other appropriate materials. The % volume ratio of the ETM to an additional material should be greater than 50% so that it is the predominate material. The ETM or any additional materials used may be the same or different than used as a host in the LEL or the spacer layers.

The same anthracene classes of electron-transporting materials, as previously described as HTMs according to formula (P) or as hosts according to formula (P—H) can also be employed as the ETM, so long as they still fulfill the oxidation and reduction potential requirements. The anthracene in the HTL or in the ETL may be the same as the anthracene in the LEL, but the same anthracene can never be both the HTM and the ETM.

In addition to any of the electron-transporting materials previously described, any other materials known to be suitable for use in the ETL may be used. Included are, but are not limited to, chelated oxinoid compounds, anthracene derivatives, pyridine-based materials, imidazoles, oxazoles, thiazoles and their derivatives, polybenzobisazoles, cyano-containing polymers and perfluorinated materials. Other electron-transporting materials include various butadiene derivatives as disclosed in U.S. Pat. No. 4,356,429 and various heterocyclic optical brighteners as described in U.S. Pat. No. 4,539,507.

A preferred class of benzazoles is described by Shi et al. in U.S. Pat. Nos. 5,645,948 and 5,766,779. Such compounds are represented by structural formula (Q):

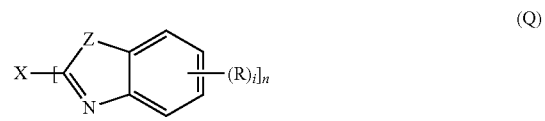

In formula (Q), n is selected from 2 to 8 and i is selected from 1-5;

Z is independently O, NR or S;

R is individually hydrogen; alkyl of from 1 to 24 carbon atoms, for example, propyl, t-butyl, heptyl, and the like; aryl or hetero-atom substituted aryl of from 5 to 20 carbon atoms, for example, phenyl and naphthyl, furyl, thienyl, pyridyl, quinolinyl and other heterocyclic systems; or halo such as chloro, fluoro; or atoms necessary to complete a fused aromatic ring; and X is a linkage unit consisting of carbon, alkyl, aryl, substituted alkyl, or substituted aryl, which conjugately or unconjugately connects the multiple benzazoles together.

An example of a useful benzazole is 2,2',2"-(1,3,5-phenylene)tris[1-phenyl-1H-benzimidazole] (TPBI) represented by a formula (Q-1) shown below:

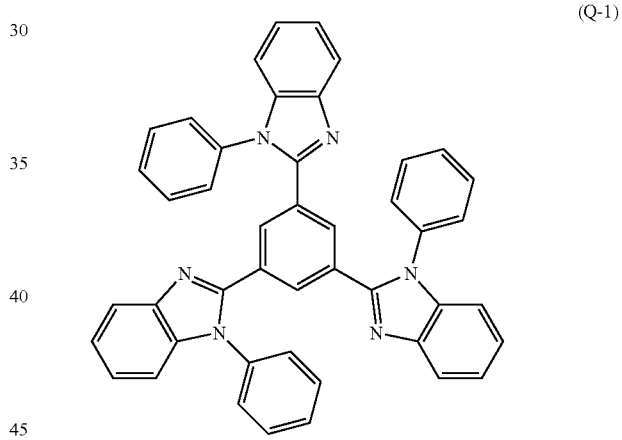

Another suitable class of the electron-transporting materials includes various substituted phenanthrolines as represented by formula (R) as discussed previously.

Suitable triarylboranes that function as an electron-transporting material may be selected from compounds having the chemical formula (S):

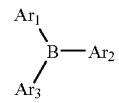

wherein:

$Ar_1$ to $Ar_3$ are independently an aromatic hydrocarbocyclic group or an aromatic heterocyclic group which may have a substituent. It is preferable that compounds having the above structure are selected from formula (S-1):

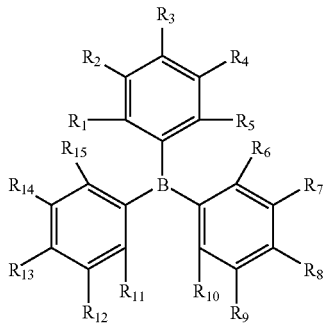
(S-1)

wherein:

$R_1$-$R_{15}$ are independently hydrogen, fluoro, cyano, trifluoromethyl, sulfonyl, alkyl, aryl or substituted aryl group.

Specific representative embodiments of the triarylboranes include:

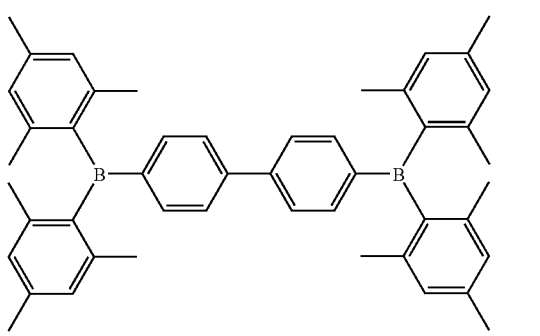
(S-1)

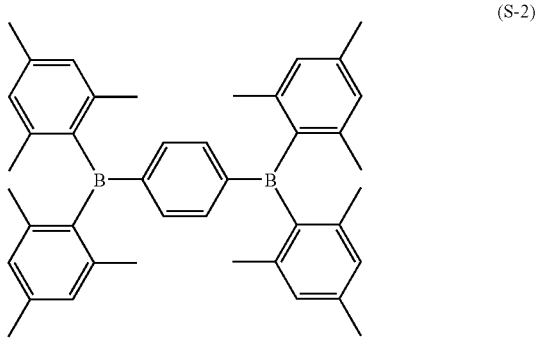
(S-2)

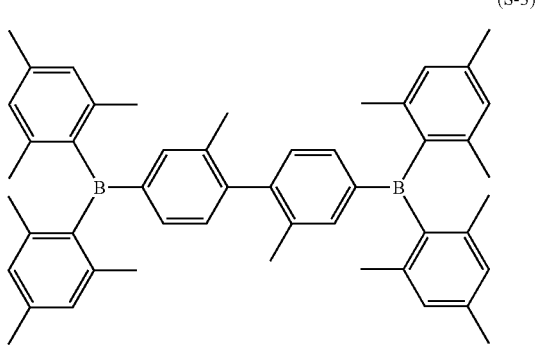
(S-3)

The electron-transporting material may also be selected from substituted 1,3,4-oxadiazoles of formula (T):

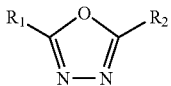
(T)

wherein:

$R_1$ and $R_2$ are individually hydrogen; alkyl of from 1 to 24 carbon atoms, for example, propyl, t-butyl, heptyl, and the like; aryl or hetero-atom substituted aryl of from 5 to 20 carbon atoms, for example, phenyl and naphthyl, furyl, thienyl, pyridyl, quinolinyl and other heterocyclic systems; or halo such as chloro, fluoro; or atoms necessary to complete a fused aromatic ring.

Illustrative of the useful substituted oxadiazoles are the following:

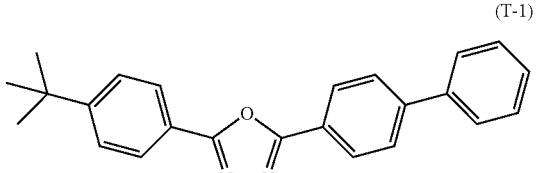
(T-1)

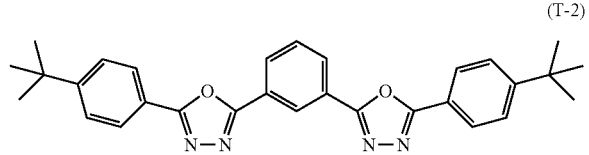
(T-2)

The electron-transporting material may also be selected from substituted 1,2,4-triazoles according to formula (U):

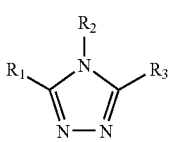
(U)

wherein:

$R_1$, $R_2$ and $R_3$ are independently hydrogen, alkyl group, aryl or substituted aryl group, and at least one of $R_1$-$R_3$ is aryl group or substituted aryl group. An example of a useful triazole is 3-phenyl-4-(1-naphtyl)-5-phenyl-1,2,4-triazole represented by formula (U-1):

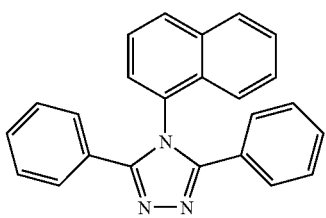
(U-1)

The electron-transporting material may also be selected from substituted 1,3,5-triazines. Examples of suitable materials are:

2,4,6-tris(diphenylamino)-1,3,5-triazine;
2,4,6-tricarbazolo-1,3,5-triazine;

2,4,6-tris(N-phenyl-2-naphthylamino)-1,3,5-triazine;
2,4,6-tris(N-phenyl-1-naphthylamino)-1,3,5-triazine;
4,4',6,6'-tetraphenyl-2,2'-bi-1,3,5-triazine;
2,4,6-tris([1,1':3',1''-terphenyl]-5'-yl)-1,3,5-triazine.

In addition, any of the metal chelated oxinoid compounds including chelates of oxine itself (also commonly referred to as 8-quinolinol or 8-hydroxyquinoline) of Formula (O) useful as host materials in a LEL are also suitable for use in the ETL.

Some metal chelated oxinoid compounds having high triplet energy can be particularly useful as an electron-transporting materials. Particularly useful aluminum or gallium complex host materials with high triplet energy levels are represented by Formula (V).

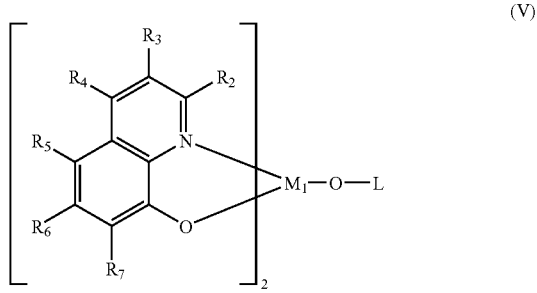

In Formula (V), $M_1$ represents Al or Ga. $R_2$-$R_7$ represent hydrogen or an independently selected substituent. Desirably, $R_2$ represents an electron-donating group. Suitably, $R_3$ and $R_4$ each independently represent hydrogen or an electron donating substituent. A preferred electron-donating group is alkyl such as methyl. Preferably, $R_5$, $R_6$, and $R_7$ each independently represent hydrogen or an electron-accepting group. Adjacent substituents, $R_2$-$R_7$, may combine to form a ring group. L is an aromatic moiety linked to the aluminum by oxygen, which may be substituted with substituent groups such that L has from 6 to 30 carbon atoms.

Illustrative of useful chelated oxinoid compounds for use in the ETL is Aluminum(III) bis(2-methyl-8-hydroxyquinoline)-4-phenylphenolate[alias, Balq].

The thickness of the ETL is in the range of from 5 nm to 200 nm, preferably, in the range of from 10 nm to 150 nm.

Electron Injection Layer

In some embodiments, an electron-injection layer 138 is employed. For example, the EIL may be an n-type doped layer containing at least one electron-transporting material as a host and at least one n-type dopant. The dopant is capable of reducing the host by charge transfer. The term "n-type doped layer" means that this layer has semiconducting properties after doping, and the electrical current through this layer is substantially carried by the electrons.

The host in the EIL may be an electron-transporting material capable of supporting electron injection and electron transport. The electron-transporting material can be selected from the electron-transporting materials for use in the ETL region as defined above. One particularly useful EIL host would be a phenanthroline according to Formula (R).

The n-type dopant in the n-type doped EIL may be is selected from alkali metals, alkali metal compounds, alkaline earth metals, or alkaline earth metal compounds, or combinations thereof. The term "metal compounds" includes organometallic complexes, metal-organic salts, and inorganic salts, oxides and halides. Among the class of metal-containing n-type dopants, Li, Na, K, Rb, Cs, Mg, Ca, Sr, Ba, La, Ce, Sm, Eu, Tb, Dy, or Yb, and their compounds, are particularly useful. The materials used as the n-type dopants in the n-type doped EIL also include organic reducing agents with strong electron-donating properties. By "strong electron-donating properties" it is meant that the organic dopant should be able to donate at least some electronic charge to the host to form a charge-transfer complex with the host. Nonlimiting examples of organic molecules include bis(ethylenedithio)-tetrathiafulvalene (BEDT-TTF), tetrathiafulvalene (TTF), and their derivatives. In the case of polymeric hosts, the dopant is any of the above or also a material molecularly dispersed or copolymerized with the host as a minor component. Preferably, the n-type dopant in the n-type doped EIL includes Li, Na, K, Rb, Cs, Mg, Ca, Sr, Ba, La, Ce, Nd, Sm, Eu, Tb, Dy, or Yb, or combinations thereof. The n-type doped concentration is preferably in the range of 0.01-20% by volume of this layer. When an n-type doped EIL is employed, the thickness is typically less than 200 nm, and preferably in the range of less than 150 nm.

In some situations, an EIL host may be used without n-doping. Useful materials that may be used without n-doping include the phenanthrolines of Formula (R) or organic alkali or alkaline earth metal complexes. Preferred examples of the latter organic metal complexes would be according to Formula (V):

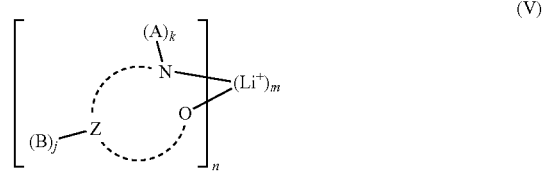

wherein:
Z and the dashed arc represent two to four atoms and the bonds necessary to complete a 5- to 7-membered ring with the lithium cation;
each A represents hydrogen or a substituent and each B represents hydrogen or an independently selected substituent on the Z atoms, provided that two or more substituents may combine to form a fused ring or a fused ring system;
j is 0-3 and k is 1 or 2; and
m and n are independently selected integers selected to provide a neutral charge on the complex.

It is most desirable that the A and B substituents of Formula (V) together form an additional ring system. This additional ring system may further contain additional heteroatoms to form a multidentate ligand with coordinate or dative bonding to the lithium. Desirable heteroatoms are nitrogen or oxygen. A specific example of a compound of this type is Liq (lithium 8-hydroxyquinolate).

The thickness of an undoped EIL is typically less than 20 nm, and preferably in the range of 10 nm or less.

Cathode

When light emission is viewed solely through the anode, the cathode 140 includes nearly any conductive material. Desirable materials have effective film-forming properties to ensure effective contact with the underlying organic layer, promote electron injection at low voltage, and have effective stability. Useful cathode materials often contain a low work function metal (<4.0 eV) or metal alloy. One preferred cathode material includes a Mg:Ag alloy as described in U.S. Pat. No. 4,885,221. Another suitable class of cathode materials includes bilayers including a thin inorganic EIL in contact with an organic layer (e.g., organic EIL or ETL), which is capped with a thicker layer of a conductive metal. Here, the inorganic EIL preferably includes a low work function metal or metal salt and, if so, the thicker capping layer does not need to have a low work function. One such cathode includes a thin layer of LiF followed by a thicker layer of Al as described in U.S. Pat. No. 5,677,572. Other useful cathode material sets include, but are not limited to, those disclosed in U.S. Pat. Nos. 5,059,861, 5,059,862, and 6,140,763.

When light emission is viewed through the cathode, cathode 140 should be transparent or nearly transparent. For such applications, metals should be thin or one should use transparent conductive oxides, or include these materials. Optically transparent cathodes have been described in more detail in U.S. Pat. Nos. 4,885,211, 5,247,190, 5,703,436, 5,608,287, 5,837,391, 5,677,572, 5,776,622, 5,776,623, 5,714,838, 5,969,474, 5,739,545, 5,981,306, 6,137,223, 6,140,763, 6,172,459, 6,278,236, 6,284,393, and EP 1 076 368. Cathode materials are typically deposited by thermal evaporation, electron beam evaporation, ion sputtering, or chemical vapor deposition. When needed, patterning is achieved through many well known methods including, but not limited to, through-mask deposition, integral shadow masking, for example as described in U.S. Pat. No. 5,276,380 and EP 0 732 868, laser ablation, and selective chemical vapor deposition.

Substrate

OLED 100 is typically provided over a supporting substrate 110 where either the anode 120 or cathode 140 can be in contact with the substrate. The electrode in contact with the substrate is conveniently referred to as the bottom electrode. Conventionally, the bottom electrode is the anode 120, but this invention is not limited to that configuration. The substrate can either be light transmissive or opaque, depending on the intended direction of light emission. The light transmissive property is desirable for viewing the EL emission through the substrate. Transparent glass or plastic is commonly employed in such cases. The substrate can be a complex structure comprising multiple layers of materials. This is typically the case for active matrix substrates wherein TFTs are provided below the OLED layers. It is still necessary that the substrate, at least in the missive pixelated areas, be comprised of largely transparent materials such as glass or polymers. For applications where the EL emission is viewed through the top electrode, the transmissive characteristic of the bottom support is immaterial, and therefore the substrate can be light transmissive, light absorbing or light reflective. Substrates for use in this case include, but are not limited to, glass, plastic, semiconductor materials such as silicon, ceramics, and circuit board materials. Again, the substrate can be a complex structure comprising multiple layers of materials such as found in active matrix TFT designs. It is necessary to provide in these device configurations a light-transparent top electrode.

Deposition of Organic Layers

The organic materials mentioned above are suitably deposited through sublimation, but can be deposited from a solvent with an optional binder to improve film formation. If the material is a polymer, solvent deposition is usually preferred. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. No. 5,851,709 and U.S. Pat. No. 6,066,357) and inkjet method (U.S. Pat. No. 6,066,357).

Organic materials useful in making OLEDs, for example organic hole-transporting materials, organic light-emitting materials doped with an organic electroluminescent components have relatively complex molecular structures with relatively weak molecular bonding forces, so that care must be taken to avoid decomposition of the organic material(s) during physical vapor deposition. The aforementioned organic materials are synthesized to a relatively high degree of purity, and are provided in the form of powders, flakes, or granules. Such powders or flakes have been used heretofore for placement into a physical vapor deposition source wherein heat is applied for forming a vapor by sublimation or vaporization of the organic material, the vapor condensing on a substrate to provide an organic layer thereon.

Several problems have been observed in using organic powders, flakes, or granules in physical vapor deposition: These powders, flakes, or granules are difficult to handle. These organic materials generally have a relatively low physical density and undesirably low thermal conductivity, particularly when placed in a physical vapor deposition source which is disposed in a chamber evacuated to a reduced pressure as low as $10^{-6}$ Torr. Consequently, powder particles, flakes, or granules are heated only by radiative heating from a heated source, and by conductive heating of particles or flakes directly in contact with heated surfaces of the source. Powder particles, flakes, or granules which are not in contact with heated surfaces of the source are not effectively heated by conductive heating due to a relatively low particle-to-particle contact area; This can lead to nonuniform heating of such organic materials in physical vapor deposition sources. Therefore, result in potentially nonuniform vapor-deposited organic layers formed on a substrate.

These organic powders can be consolidated into a solid pellet. These solid pellets consolidating into a solid pellet from a mixture of a sublimable organic material powder are easier to handle. Consolidation of organic powder into a solid pellet can be accomplished with relatively simple tools. A solid pellet formed from mixture comprising one or more non-luminescent organic non-electroluminescent component materials or luminescent electroluminescent component materials or mixture of non-electroluminescent component and electroluminescent component materials can be placed into a physical vapor deposition source for making organic layer. Such consolidated pellets can be used in a physical vapor deposition apparatus.

In one aspect, the present invention provides a method of making an organic layer from compacted pellets of organic materials on a substrate, which will form part of an OLED.

One preferred method for depositing the materials of the present invention is described in US 2004/0255857 and U.S. Ser. No. 10/945,941 where different source evaporators are used to evaporate each of the materials of the present invention. A second preferred method involves the use of flash evaporation where materials are metered along a material feed path in which the material feed path is temperature controlled. Such a preferred method is described in the following co-assigned patent applications: U.S. Ser. No. 10/784,585; U.S. Ser. No. 10/805,980; U.S. Ser. No. 10/945,940; U.S. Ser. No. 10/945,941; U.S. Ser. No. 11/050,924; and U.S. Ser. No. 11/050,934. Using this second method, each material may be evaporated using different source evaporators or the solid materials may be mixed prior to evaporation using the same source evaporator.

Encapsulation

Most OLED devices are sensitive to moisture and/or oxygen so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890.

OLED Device Design Criteria

For full color display, the pixelation of LELs can be needed. This pixelated deposition of LELs is achieved using shadow masks, integral shadow masks, U.S. Pat. No. 5,294,870, spatially defined thermal dye transfer from a donor sheet, U.S. Pat. Nos. 5,688,551, 5,851,709, and 6,066,357, and inkjet method, U.S. Pat. No. 6,066,357.

OLED devices of this invention can employ various well-known optical effects in order to enhance its properties if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color-conversion filters over the display. Filters, polarizers, and anti-glare or anti-reflection coatings may be specifically provided over the cover or as part of the cover.

Embodiments of the invention may provide EL devices that have good luminance efficiency, good operational stability, and reduced drive voltages. Embodiments of the invention may also give reduced voltage rises over the lifetime of the devices and can be produced with high reproducibility and consistently to provide good light efficiency. They may have lower power consumption requirements and, when used with a battery, provide longer battery lifetimes.

EXPERIMENTAL EXAMPLES

The materials used in the examples may be prepared by the methods known in the art.

Example 1

Preparation of OLED Devices 1.1 Through 1.8

The invention and its advantages are further illustrated by the specific examples that follow. The term "percentage" or "percent" and the symbol "%" indicate the volume percent (or a thickness ratio as measured on a thin film thickness monitor) of a particular compound of the total material in the layer of the invention.

A series of comparative OLED devices (1.1 through 1.8) were constructed in the following manner:

1. A glass substrate coated with an 85 nm layer of indium-tin oxide (ITO), as the anode, was sequentially ultrasonicated in a commercial detergent, rinsed in deionized water and exposed to oxygen plasma for about 1 min.
2. Over the ITO was deposited a 1 nm fluorocarbon ($CF_x$) hole-injecting layer (HIL) by plasma-assisted deposition of $CHF_3$ as described in U.S. Pat. No. 6,208,075.
3. Next a hole-transporting layer (HTL) of P-2 was deposited to a thickness of 95 nm.
4. A 20 nm light-emitting layer (LEL) corresponding to the host material P-2 and 1.5% by volume of FD-54 was then deposited.
5. A 35 nm electron-transporting layer (ETL) of ALQ was vacuum-deposited over the LEL.
6. An 0.5 nm electron-injecting layer (EIL) of LiF was vacuum-deposited over the ETL.
7. And finally, a 100 nm layer of aluminum was deposited onto the EIL, to form the cathode.

The above sequence completes the deposition of the EL device. The device was then hermetically packaged in a dry glove box for protection against ambient environment.

Device 1.2 was prepared as Device 1.1 except 4,4'-Bis[N-(1-naphthyl)-N-phenylamino]biphenyl (NPB) replaced P-2 in the HTL of step 3.

Device 1.3 was prepared as Device 1.1 except the thickness of the ETL layer of step 5 was increased to 55 nm.

Device 1.4 was prepared as Device 1.2 except the thickness of the ETL layer of step 5 was increased to 55 nm.

Device 1.5 was prepared as Device 1.2 except that Bphen (R-2) replaced the ALQ in the ETL of step 5.

Device 1.6 was prepared as Device 1.5 except that P-2 replaced NPB in the HIL of step 3.

Device 1.7 was prepared as Device 1.5 except the thickness of the ETL layer of step 5 was increased to 55 nm.

Device 1.8 was prepared as Device 1.6 except the thickness of the ETL layer of step 5 was increased to 55 nm.

The devices thus formed were tested for drive voltage, luminous efficiency (as candelas per amp (cd/A)) or % EQE (external quantum efficiency—calculated from normal direction luminance assuming a lambertian emission characteristic) at an operating current of 20 mA/cm$^2$ and the results are reported in Table 3.

TABLE 3

Results of Devices 1.1-1.8

| Example (Type) | HTM | ETM | Drive Volt. (Volts) | Efficiency (cd/A) | % EQE |
|---|---|---|---|---|---|
| 1.1 (Comparative) | P-2 | ALQ | 7.63 | 3.08 | 1.55 |
| 1.2 (Comparative) | NPB | ALQ | 7.13 | 3.16 | 2.69 |
| 1.3 (Comparative) | P-2 | ALQ | 8.19 | 4.91 | 1.94 |
| 1.4 (Comparative) | NPB | ALQ | 8.22 | 3.56 | 2.15 |
| 1.5 (Comparative) | NPB | Bphen | 5.64 | 5.89 | 5.69 |
| 1.6 (Inventive) | P-2 | Bphen | 5.97 | 6.43 | 6.96 |
| 1.7 (Comparative) | NPB | Bphen | 10.3 | 3.02 | 2.50 |
| 1.8 (Inventive) | P-2 | Bphen | 7.25 | 4.51 | 4.09 |

In Table 3, P-2 ($E_{ox}$=1.31, $E_{red}$=−1.86) represents a HTM which is a hydrocarbon with no bonds having an energy less than 105 kcal/mol whereas NPB ($E_{ox}$=0.86, $E_{red}$=−2.60) is a HTM that contains bonds weaker than 105 kcal/mol. Thus, NPB in the HTM is never inventive without regard to the properties of the ETM. The combination of P-2 in the HTL with ALQ ($E_{ox}$=1.20, $E_{red}$=−2.00) in the ETL (as per devices 1.1 and 1.3) is not inventive since the $E_{ox}$ of P-2 is not 0.2 V less positive than ALQ (1.31 vs 1.20) and the $E_{red}$ of ALQ is not more positive than 0.05 V more negative than P-2 (−2.00 vs −1.86). The voltage and efficiency of devices 1.1-1.4, which contain these combinations, are insufficient. The combination of P-2 in the HTL and Bphen in the ETL is inventive since the $E_{ox}$ of P-2 is 0.2 V less positive than Bphen (1.31 vs 1.80) and the $E_{red}$ of Bphen is more positive than 0.05 V more negative than P-2 (−1.90 vs −1.86−0.05=−1.91). Comparison of inventive devices 1.6 and 1.8 to comparative devices 1.5 and 1.7 demonstrate some improvement in voltage but a substantial and unexpected improvement in efficiency.

Example 2

Preparation of Devices 2.1 Through 2.13

A series of EL devices (2.1 through 2.13) were constructed in the following manner:

1. A glass substrate coated with an 85 nm layer of indium-tin oxide (ITO), as the anode, was sequentially ultrasonicated in a commercial detergent, rinsed in deionized water and exposed to oxygen plasma for about 1 min.
2. Over the ITO was deposited a 1 nm fluorocarbon ($CF_x$) hole-injecting layer (HIL) by plasma-assisted deposition of $CHF_3$ as described in U.S. Pat. No. 6,208,075.
3. Next a layer of hole-transporting material P-2 was deposited to a thickness of 95 nm.
4. A 20 nm light-emitting layer (LEL) corresponding to the host material P-2 and 1.3% by volume of FD-54 was then deposited.
5. A 25 nm electron-transporting layer (ETL) of ETM21 was vacuum-deposited over the LEL.
6. An 10 nm electron-injecting layer (EIL) of Bphen was vacuum-deposited over the ETL.
7. And finally, a 100 nm layer of aluminum was deposited onto the EIL, to form the cathode.

The above sequence completes the deposition of the EL device. The device was then hermetically packaged in a dry glove box for protection against ambient environment.

Device 2.2 was prepared as Device 2.1 except that NPB replaced P-2 in the HTL of step 3.

Device 2.3 was prepared as Device 2.1 except a second 20 nm thick LEL of ETM21 and 1.5% FD-54 was added between the first LEL of step 4 and the ETL of step 5 and the thickness of the ETL of step 5 was decreased to 5 nm.

Device 2.4 was prepared as Device 2.3 except NPB replaced P-2 in the HTL of step 3.

Device 2.5 was prepared as Device 2.1 except that the thickness of the ETL layer of step 5 was increased to 45 nm.

Device 2.6 was prepared as Device 2.5 except that NPB replaced P-2 in the HTL of step 3.

Device 2.7 was prepared as Device 2.3 except the thickness of the ETL layer of step 5 was increased to 25 nm.

Device 2.8 was prepared as Device 2.7 except P-1 replaced P-2 in the HTM of step 3.

Device 2.9 was prepared as Device 2.4 except the thickness of the ETL layer of step 5 was increased to 25 nm.

Device 2.10 was prepared as Device 2.3 except both the ETL of step 5 and the EIL of step 6 was replaced with a single 35 nm ETL of GaC-7.

Device 2.11 was prepared as device 2.10 except NPB replaced P-2 in the HTL of step 3.

Device 2.12 was prepared as Device 2.10 except the second LEL was removed and the thickness of the ETL layer increased to 55 nm.

The devices thus formed were tested for drive voltage, luminous efficiency (as candelas per amp (cd/A)) or % EQE (external quantum efficiency) at an operating current of 20 $mA/cm^2$ and the results are reported in Table 4.

TABLE 4

Results of Devices 2.1-2.12

| Example (Type) | HTM | ETL | Drive Volt. (Volts) | Efficiency (cd/A) | % EQE |
|---|---|---|---|---|---|
| 2.1 (Inventive) | P-2 | ETM21 | 4.57 | 7.92 | 8.03 |
| 2.2 (Comparative) | NPB | " | 4.50 | 4.80 | 4.95 |
| 2.3 (Inventive) | P-2 | " | 5.34 | 5.84 | 6.56 |
| 2.4 (Comparative) | NPB | " | 4.69 | 4.75 | 4.81 |
| 2.5 (Inventive) | P-2 | " | 5.50 | 7.59 | 7.57 |
| 2.6 (Comparative) | NPB | " | 4.79 | 5.43 | 5.14 |
| 2.7 (Inventive) | P-2 | " | 5.60 | 7.88 | 7.94 |
| 2.8 (Inventive) | P-1 | " | 6.07 | 7.42 | 6.78 |
| 2.9 (Comparative) | NPB | " | 4.86 | 5.61 | 5.31 |
| 2.10 (Inventive) | P-2 | GaC-7 | 7.88 | 5.38 | 4.69 |
| 2.11 (Comparative) | NPB | " | 7.66 | 3.93 | 3.46 |
| 2.12 (Inventive) | P-2 | " | 7.69 | 5.27 | 4.82 |

From Table 4, it can be seen that the inventive examples with a HTM of the invention have similar or lower drive voltages and significantly improved luminance efficiency than the comparison devices. The combination of P-2 in the HTL and ETM21 ($E_{ox}$=1.60, $E_{red}$=−1.73) in the ETL is inventive since the $E_{ox}$ of P-2 is 0.2 V less positive than ETM21 (1.31 vs 1.60) and the $E_{red}$ of ETM21 is more positive than 0.05 V more negative than P-2 (−1.73 vs −1.86−0.05=−1.91). The combination of P-2 in the HTL and GaC-7 ($E_{ox}$=1.60, $E_{red}$=−1.63) in the ETL is inventive since the $E_{ox}$ of P-2 is 0.2 V less positive than GaC-7 (1.31 vs 1.60) and the $E_{red}$ of GaC-7 is more positive than 0.05 V more negative than P-2 (−1.63 vs −1.86−0.05=−1.91).

The invention has been described in detail with particular reference to certain preferred embodiments thereof, but it will be understood that variations and modifications can be effected within the spirit and scope of the invention. The patents and other publications referred to are incorporated herein in their entirety.

PARTS LIST

100 OLED
110 Substrate
120 Anode
130 Hole-Injecting layer (HIL)
132 Hole-Transporting layer (HTL)
134 Light-Emitting layer (LEL)
135 Hole-Blocking Layer (HBL)
136 Electron-Transporting layer (ETL)
138 Electron-Injecting layer (EIL)
140 Cathode
150 Voltage/Current Source
160 Electrical Connectors

The invention claimed is:
1. An OLED device comprising, in the following order, an anode, a hole transporting layer (HTL), a light-emitting layer

(LEL) comprising a host molecule and a light-emitting molecule, an electron transporting layer (ETL) and a cathode and wherein:
  (i) the HTL comprises a hole transporting material (HTM) having an oxidation potential that is at least 0.2 V less positive than the oxidation potential of a predominant material in the ETL and does not contain any bonds having an energy less than 105 kcal/mol; and
  (ii) the ETL comprises an electron transporting material (ETM) having a reduction potential ($RP_{etm}$) relative to the reduction potential of a predominant material in the HTL ($RP_{htm}$) that meets the requirement of $RP_{etm} > (RP_{htm} - 0.05)$.

2. The OLED device of claim 1 wherein the oxidation potential of the HTM is at least 0.3 V less positive than the oxidation potential of the predominant material in the ETL.

3. The OLED device of claim 1 wherein the reduction potential of the ETM is more positive than the reduction potential of the predominant material in the HTL.

4. The OLED device of claim 1 where the HTM is an anthracene compound.

5. The OLED device of claim 4 wherein the anthracene compound is according to Formula (P):

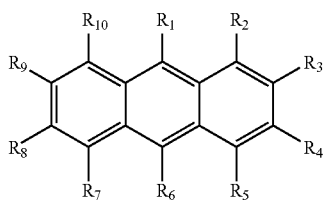

wherein
  $R_1$-$R_{10}$ are independently chosen from hydrogen or aromatic groups from 1-24 carbon atoms.

6. The OLED device of claim 1 wherein the ETM is a fluoranthene compound.

7. The OLED device of claim 6 wherein the fluoranthene compound is according to the Formula (I):

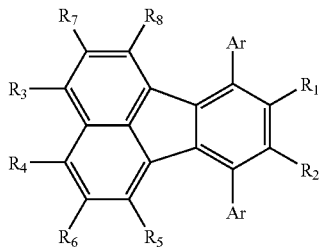

wherein
  each Ar is an aromatic ring containing 6 to 24 carbon atoms bonded to the fluoranthene nucleus and they can be are the same or different; and
  $R_1$-$R_8$ are individually selected from hydrogen and aromatic ring groups containing 6 to 24 carbon atoms with the proviso that no two adjacent $R_1$-$R_8$ substituents can join to form an aromatic ring system fused to the fluoranthene nucleus.

8. The OLED device of claim 1 wherein the ETM is a phenanthroline compound.

9. The OLED device of claim 8 wherein the phenathroline compound is according to the Formula (R):

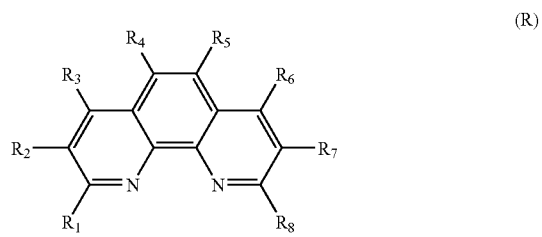

wherein
  $R_1$-$R_8$ are independently hydrogen, alkyl group, aryl or substituted aryl group, and at least one of $R_1$-$R_8$ is aryl group or substituted aryl group.

10. The OLED device of claim 1 wherein the ETM is according to Formula ($G_a$):

$$GaL_3 \quad (G_a)$$

wherein:
  the gallium is in a +3 valence state; and
  L represent a monoionic ligand such that the complex has an overall neutral charge, each L may be the same or different and at least one L must be organic.

11. The OLED device of claim 10 wherein the gallium complex is according to Formula ($G_a$-1):

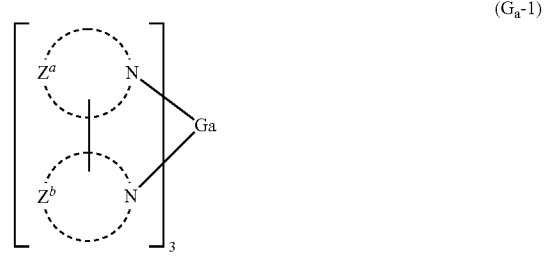

wherein:
  each $Z^a$ and $Z^b$ is independently selected and represents the atoms necessary to complete an unsaturated heterocyclic ring and each heterocyclic ligand can be the same or different.

12. The OLED of claim 1 wherein the electron transporting layer is in direct contact with the light-emitting layer.

13. The OLED of claim 1 wherein the light-emitting layer emits blue light.

14. The OLED of claim 13 wherein the light-emitting molecule is chosen from the group consisting of bis(azinyl) azene boron complex compounds, bis[2-[4-[N,N-diarylamino]phenyl]vinyl]-benzenes, [N,N-diarylamino][2-[4-[N,N- diarylamino]phenyl]vinyl]biphenyls and bis[2-[4-[N, N-diarylamino]phenyl]vinyl]biphenyls.

15. The OLED of claim 14 wherein the HTM is an anthracene compound.

16. The OLED of claim 1 wherein the HTM has an oxidation potential of 1.50 V or less and a reduction potential of −1.70 V or more negative.

17. The OLED of claim 16 wherein the HTM has an oxidation potential of less than 1.35 V and a reduction potential more negative than −1.80 V.

18. The OLED of claim 1 wherein the ETM has an oxidation potential of 1.50 V or greater and a reduction potential of −1.95 V or less negative.

19. A method of emitting light comprising applying an electric potential across the device of claim 1.

20. A display comprising the device of claim 1.

* * * * *